United States Patent
Jahangir et al.

(10) Patent No.: US 10,777,410 B2
(45) Date of Patent: Sep. 15, 2020

(54) SYNTHESIS AND FABRICATION OF TRANSITION METAL DICHALCOGENIDE STRUCTURES

(71) Applicant: University of South Carolina, Columbia, SC (US)

(72) Inventors: Ifat Jahangir, Hillsboro, OR (US); Goutam Koley, Anderson, SC (US); MVS Chandrashekhar, Columbia, SC (US)

(73) Assignee: University of South Carolina, Columbia, SC (US)

( * ) Notice: Subject to any disclaimer, the term of this patent is extended or adjusted under 35 U.S.C. 154(b) by 29 days.

(21) Appl. No.: 15/886,911

(22) Filed: Feb. 2, 2018

(65) Prior Publication Data

US 2018/0226248 A1    Aug. 9, 2018

Related U.S. Application Data

(60) Provisional application No. 62/454,298, filed on Feb. 3, 2017.

(51) Int. Cl.
*H01L 21/02* (2006.01)
*H01L 29/78* (2006.01)
(Continued)

(52) U.S. Cl.
CPC .... *H01L 21/02568* (2013.01); *H01L 21/0242* (2013.01); *H01L 21/02381* (2013.01);
(Continued)

(58) Field of Classification Search
CPC ........... H01L 21/02568; H01L 29/7391; H01L 29/66969; H01L 29/66742; H01L 29/78681; H01L 29/778; H01L 21/02488; H01L 21/0242; H01L 21/02381; H01L 29/24; H01L 21/2636; H01L 21/324; H01L 21/76895; H01L 29/7839; H01L 21/02614
See application file for complete search history.

(56) References Cited

U.S. PATENT DOCUMENTS

| | | | | |
|---|---|---|---|---|
| 2001/0026166 A1* | 10/2001 | Khoury | .............. | G01R 1/07307 324/754.2 |
| 2002/0079987 A1* | 6/2002 | Yip | .......................... | H03H 3/08 333/193 |

(Continued)

OTHER PUBLICATIONS

Butler et al., "Progress, Challenges, and Opportunities in Two-Dimensional Materials Beyond Graphene", ACS Nano, 7-4, 2013, pp. 2898-2926.

(Continued)

*Primary Examiner* — Cuong B Nguyen
(74) *Attorney, Agent, or Firm* — Dority & Manning, P.A.

(57) ABSTRACT

Methods of synthesis and fabrication of a transition metal dichalcogenide (TMD) structures are disclosed. A method can include first patterning a transition metal (TM) on a substrate and placing the substrate in a process chamber. Oxygen can be applied to the transition metal on the substrate and a mixture of highly reactive transition metal oxides can be formed and simultaneously thinned down by sublimation. Finally, a chalcogen can be applied to the substrate and a transition metal dichalcogenide structure can be formed.

18 Claims, 16 Drawing Sheets

(51) Int. Cl.
*H01L 29/24* (2006.01)
*H01L 21/768* (2006.01)
*H01L 21/324* (2006.01)
*H01L 21/263* (2006.01)
*H01L 29/739* (2006.01)
*H01L 29/786* (2006.01)
*H01L 29/778* (2006.01)
*H01L 29/66* (2006.01)

(52) U.S. Cl.
CPC .. *H01L 21/02488* (2013.01); *H01L 21/02614* (2013.01); *H01L 21/2636* (2013.01); *H01L 21/324* (2013.01); *H01L 21/76895* (2013.01); *H01L 29/24* (2013.01); *H01L 29/66742* (2013.01); *H01L 29/66969* (2013.01); *H01L 29/7391* (2013.01); *H01L 29/778* (2013.01); *H01L 29/7839* (2013.01); *H01L 29/78681* (2013.01)

(56) References Cited

U.S. PATENT DOCUMENTS

| | | | |
|---|---|---|---|
| 2016/0109395 A1 | 4/2016 | Koley et al. | |
| 2016/0233322 A1* | 8/2016 | Yeh | H01L 29/66969 |
| 2017/0345944 A1* | 11/2017 | Lin | H01L 29/778 |

OTHER PUBLICATIONS

Castellano-Gomez et al., "Laser-Thinning of MoS2: On Demand Generation of a Single-Layer Semiconductor", Nano Letters, 12, 2012, pp. 3187-3192.

Chen et al., "Probing the Electron States and Metal-Insulator Transition Mechanisms in Molybdenum Disulphide Vertical Heterostructures", Nature Communications, 6, 2015, 7088.

Desai et al., "MoS2 Transistors with 1-Nanometer Gate Lengths", Science, 354-6308, pp. 99-102.

Dieterle et al., "Raman Spectroscopy of Molybdenum Oxides", Physical Chemistry Chemical Physics, 4-5, 2002, pp. 822-826.

Fiori et al., "Velocity Saturation in Few-Layer MoS2 Transistor", Applied Physics Letters, 103-23, 2013, pp. 233509.

Kim et al., "High-Mobility and Low-Power Thin-Film Transistors Based on Multilayer MoS2 Crystals", Nature Communications, 3, 2012, 1011.

Laskar et al., "P-Type Doping of MoS2 Thin Films Using Nb", Applied Physics Letters, 104, 2014, pp. 092104.

Lee et al., "Anomalous Lattice Vibrations of Single and Few-Layer MoS2", ACS Nano, 4-5, pp. 2695-2700.

Lee et al., "Synthesis of Large-Area MoS2 Atomic Layers with Chemical Vapor Deposition", Advanced Materials, 24-17, 2012, pp. 2320-2325.

Lin et al., "Mobility Enhancement and Highly Efficient Gating of Monolayer MoS2 Transistors with Polymer Electrolyte". Journal of Physics D: Applied Physics, 45. 2012, pp. 345102.

Liu et al., "Growth of Large-Area and Highly Crystalline MoS2 Thin Layers on Insulating Substrates", Nano Letters, 12, 2012, pp. 1538-1544.

Liu et al., "Layer-by-Layer Thinning of MoS2 by Plasma", ACS Nano, 7-5, 2013, pp. 4202-4209.

Mak et al., "Atomically Thin MoS2: A New Direct-Gap Semiconductor", Physical Review Letters, 105, 2010, pp. 136805.

Radisavljevic et al., "Single-Layer MoS2 Transistors" Nature Nanotechnology, 6, 2011, pp. 147-150.

Schmidt et al., "Transport Properties of Monolayer MoS2 Grown by Chemical Vapor Deposition", Nano Letters, 14, 2014, pp. 1909-1913.

Wang et al., "Electronics and Optoelectronics of Two-Dimensional Transition Metal Dichalcogenides", Nature Nanotechnology, 7, 2012, pp. 699-712.

Wu et al., "Layer Thinning and Etching of Mechanically Exfoliated MoS2 Nanosheets by Thermal Annealing in Air", Small, 9-19, 2013, pp. 3314-3319.

Xu et al., "Graphene-Like Two-Dimensional Materials", Chemical Reviews, 113, 2013, pp. 3766-3798.

Zhan et al "Large-Area Vapor-Phase Growth and Characterization of MoS2 Atomic Layers on a SiO2 Substrate", Small, 8-7, pp. 966-971.

Zhang et al.. "High-Gain Phototransistors Based on a CVD MoS2 Monolayer", Advanced Materials, 25, 2013, pp. 3456-3461.

* cited by examiner

SYNTHESIS AND FABRICATION OF TRANSITION METAL DICHALCOGENIDE STRUCTURES

CROSS-REFERENCE TO RELATED APPLICATION

The present application claims priority to U.S. Provisional Patent Application Ser. No. 62/454,298 titled "Asymmetric ambipolar FETs fabricated by large-area, transfer-free growth of a few layer $MoS_2$" of Jahangir, et al. filed on Feb. 3, 2017, the disclosure of which is incorporated by reference herein.

GOVERNMENT SUPPORT

The subject invention was made with government support under a research project supported by the National Science Foundation (NSF) grant numbers ECCS-1309466, ECCS-1029346, ECCS-1559711, and CBET 1606882. The government has certain rights in the invention.

FIELD OF THE INVENTION

The present disclosure relates to synthesis methods of transition metal dichalcogenide (TMD) for functional structures. More specifically, the present disclosure relates to efficient synthesis methods of TMD materials of very high quality, resulting in structures such as gated and non-gated diodes and transistors, for use in electronic, optoelectronic and various physical/chemical sensing applications.

BACKGROUND OF THE INVENTION

Since the discovery of graphene, there has been an increase in two-dimensional (2D) materials research for their scalability down to atomic dimensions. Among the analogs of graphene, transition metal dichalcogenides (TMDs) have been of interest due to their exceptional electronic and optoelectronic properties. Molybdenum disulfide ($MoS_2$), for example, is a TMD having several advantages over graphene and the industry workhorse, silicon (Si), including a thickness-dependent band gap.

However, several key obstacles stand in the way of the commercialization of transition metal dichalcogenides (TMDs). One obstacle in the commercialization of TMD technology is low carrier mobility over large areas for top-down devices. Although there were several early reports on the synthesis of atomically thin molybdenum disulfide with moderate mobility, transferring large area grown films to a substrate of choice leads to interface charges that degrade mobility. Thus, the prior art is in need of new synthesis methods that can allow for the commercialization and improvement of TMD products.

SUMMARY

Aspects and advantages of embodiments of the present disclosure will be set forth in part in the following description, or may be learned from the description, or may be learned through practice of the embodiments.

The present disclosure includes methods of synthesizing transition metal dichalcogenide (TMD) structures. In a specific example embodiment, the present disclosure relates to methods of synthesizing molybdenum disulfide ($MoS_2$) to fabricate functional structures. The TMD structures can be used for electronic, optoelectronic, physical/chemical sensing, and other applications.

According to an embodiment, a method of fabricating a transition metal dichalcogenide (TMD) structure can include first patterning a transition metal (TM) on a substrate and placing the substrate in a process chamber. Instead of using conventional methods of applying various chalcogen sources directly, oxygen can be applied first to the transition metal on the substrate to form transition metal oxides (TMO), which can also be thinned down simultaneously to a desired thickness by sublimation. Finally, a chalcogen (e.g., a sulfide, a selenide, a telluride, a polonide, etc.) can be applied to the substrate and a transition metal dichalcogenide structure can be formed. Due to the chemical nature of the intermediate TMOs, a TMD of superior quality can be produced at a more favorable process condition, facilitating the fabrication of electronic and optoelectronic devices, such as transistors and diodes with and without gates. In a specific embodiment, the TMD is molybdenum disulfide.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

DETAILED DESCRIPTION

Figure 1A:
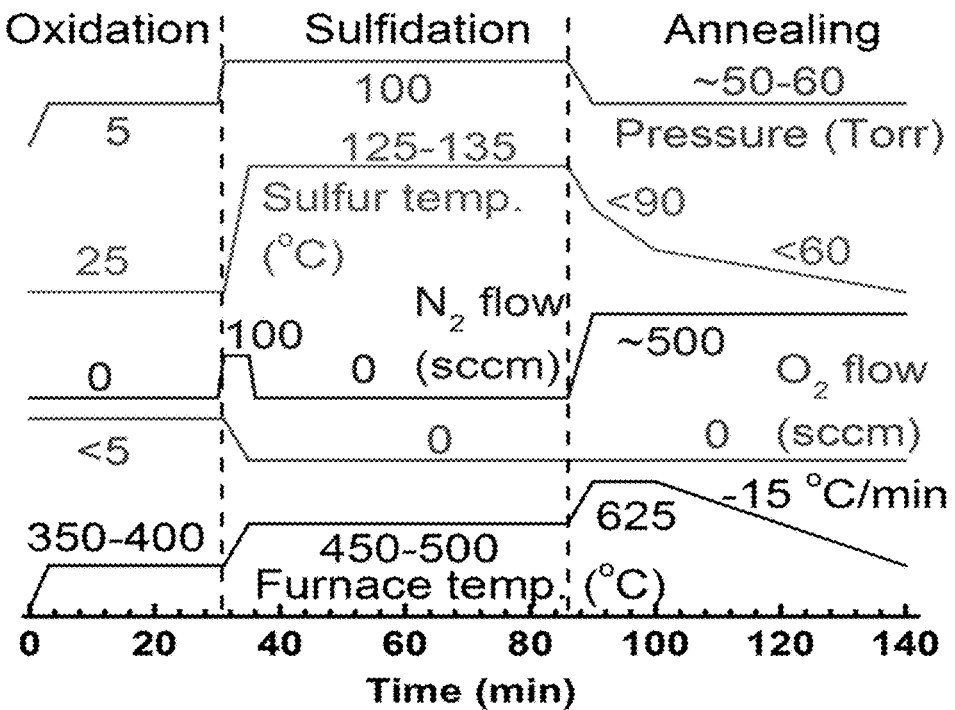
FIG. 1(a) is an illustration showing the various process steps of the synthesis of $MoS_2$ according to an embodiment of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Embodiments include top-down growth techniques for synthesizing transition metal dichalcogenide (TMD) structures. Specific applications of the resultant transition metal dichalcogenide structures include gated and non-gated diodes and transistors. According to an example embodiment, a method of fabricating a TMD structure can include patterning a transition metal (TM) on a substrate and placing the substrate in a process chamber. The "process chamber" can be implemented as multiple chambers or fabrication stages, each designated to perform one or more of the process steps of the methods described herein. The process chamber can be a furnace or other container having temperature control and suitable for applying process gasses to the substrate. The furnace can have dual temperature zones, one that can be used to hold the substrate under specific process conditions (temperature, partial pressure, gas flow, etc.) and a second for evaporating substances to contact the substrate structure. The process chamber can be prepared by vacuuming the process chamber and purging the process chamber with an inert gas such as nitrogen or argon.

The substrate can be made of any insulating or semiconducting material, for example, a doped or undoped silicon (Si) substrate with or without a silicon dioxide ($SiO_2$) coating. Prior to applying the transition metal to the substrate, a lithographic process can be performed on the substrate to create individual areas of transition metal. The transition metal areas can be formed by selective deposition, or creating a layer of transition metal followed be selective lithographic removal.

Examples of transition metals that can be applied include molybdenum (Mo), tungsten (W), tantalum (Ta), niobium (Nb), etc. and mixtures thereof. The transition metal can be applied using thermal or electron beam evaporation, physical sputtering, chemical vapor deposition, electroplating, or other methods. The layer of transition metal can be applied in a layer having a thickness ranging from few nanometers to few tens of nanometers After the transition metal is applied to the substrate, the transition metal layer can be thinned and adjusted using one of the several methods, such as laser based thermal ablation, chemical etching, etc. However, these methods can damage the surface of the thin film and induce performance-degrading defects, hence an alternative thinning mechanism is desired.

After the transition metal layer is applied to the substrate, oxygen can be applied in small quantities to the transition metal to form a mixture of several intermediate transition metal oxides (TMOs). Due to the volatility of these oxides, the process can simultaneously thin down the TMOs by sublimation, where the temperature is kept below the lowest melting point of all the TMOs. Finally, upon the application of chalcogen to the thinned down transition metal oxide, a transition metal dichalcogenide (TMD) can be formed. Without intending to be limited by theory, it is believed that producing lower quality, oxygen-deficient transition metal oxides (TMOs) results in a high concentration of chemically active sites and dangling bonds, which can make the TMOs less stable than more heavily oxidized transition metals. Further, the oxidation number of the TMOs produced can be lower than the oxidation number of more stable TMOs, thus making further chemical modification more feasible. In turn, the high number of chemically active sites (originating from intermediate oxides, oxygen vacancies, dangling bonds, and any other defect sites) makes the reaction with chalcogens easier, cleaner, more efficient, and more complete. A higher quality transition metal dichalcogenide (TMD) layer can therefore be produced. As transition metal dichalcogenides (TMDs) generally have thickness-dependent band gaps, transition metal thickness, transition metal oxide thickness, and transition metal dichalcogenide thickness are all of critical importance to the performance and properties of the resultant TMD structures.

In a specific embodiment, the TMD is molybdenum disulfide. This artificially created molybdenum disulfide has shown itself to be as good as natural crystals of the highest quality. The artificially created molybdenum disulfide also facilitates microfabrication of high-performance transistors and gated and non-gated diode structures. Embodiments of the present disclosure will now be discussed in greater detail.

The oxidizing of the transition metal (TM) layer to form the transition metal oxide (TMO) layer can occur at a first temperature range of from about 300° C. to about 450° C., and preferably from about 350° C. to about 400° C., under a steady flow of oxygen. The partial pressure of oxygen can be less than about 1 Torr, or less than about 10 Torr, or less than about 25 Torr, and can be adjusted by controlling the flow rate. Therefore, the range of oxygen partial pressure can be from about 0.1 Torr to about 25 Torr, such as from about 1 Torr to about 10 Torr. By controlling the oxygen flow rate and the temperature precisely, the TMO layer can be gradually sublimated at the same time the oxidation is taking place, and thus the thickness can be reduced to a desired value (e.g., a few nanometers). The fabrication of the transition metal oxide layer can be performed for a period of time ranging from about 15 to about 40 minutes, from about 20 to about 35 minutes, and preferably from about 25 to about 30 minutes. The flow of oxygen can be gradually tapered off within the last few minutes of the oxidation state with a steady tapering rate, as the oxidizing of the transition metal comes to an end.

A chalcogen can then be introduced to the process chamber to react with the transition metal layer (if there is any transition metal remaining), the transition metal oxide layer, or both the transition metal layer and the transition metal oxide layer. The chalcogen can be in the form of a gas and can include sulfur (S), selenium (Se), tellurium (Te), and mixtures thereof. A transition metal dichalcogenide (TMDs) layer can then be formed on the substrate. In a preferred embodiment, the transition metal is molybdenum (Mo), the chalcogen is sulfur (S), and the transition metal dichalcogenide is molybdenum disulfide ($MoS_2$).

The chalcogen (e.g., sulfur) can be introduced and contacted with the substrate and the transition metal oxide (e.g., molybdenum oxide) at a second temperature range that is greater than the first temperature range. That is, the temperature of the process chamber can be increased to form the transition metal dichalcogenide layer. The second temperature range (i.e., the temperature applied during the formation of the TMD layer) can range from about 400° C. to about 550° C., such as from about 425° C. to about 525° C., and such as from about 450° C. to about 500° C. The second temperature range can advantageously be low to avoid substrate (e.g., $SiO_2$) contamination by diffused chalcogen (e.g., S) atoms, which allows the as-grown films to be used without transfer to different substrates, while maintaining high performance transistor and diode characteristics on the substrate (e.g., an $SiO_2$ substrate). That is, the second temperature can be less than about 650° C., such as less than about 600° C., such as less than about 550° C. and such as less than about 500° C.

The chalcogen can be introduced to the process chamber in gaseous form by, for example, placing solid chalcogen in the second temperature zone of the process chamber. The temperature of the second zone can be controlled to vaporize the chalcogen and control the partial pressure of the chalcogen gas in the process chamber. Alternatively, chalcogen gas (e.g., a steady stream of chalcogen gas) can be introduced to the process chamber. The partial pressure of the chalcogen gas can be less than about 1 Torr, or can be less than about 10 Torr, or can be less than about 20 Torr. Further, the partial pressure of chalcogen gas can range from about 0.1 Torr to about 20 Torr, such as from about 1 Torr to about 20 Torr. When the chalcogen is sulfur, the temperature of the second zone of the process chamber can preferably be from about 115° C. to about 145° C., and more preferably from about 125° C. to about 135° C. The chalcogen can be applied to the substrate for a period of from about 20 minutes to about 80 minutes, such as from about 30 minutes to about 60 minutes, and such as from about from 40 minutes to about 60 minutes. In an embodiment, the resultant transition metal dichalcogenide (TMD) layer can include from 1 to 10 monolayers, such as from 2 to 7 monolayers, and such as from 3 to 6 monolayers of transition metal dichalcogenide.

After the transition metal dichalcogenide (TMD) layer is formed, the application of the chalcogen can be stopped and the process chamber can be vacuumed and purged with an inert gas such as nitrogen or argon. A first annealing step can then be performed in presence of an inert gas such as nitrogen or argon to improve the crystallinity and quality of the transition metal dichalcogenide (TMD) structure. The first annealing step can be performed at a third temperature and the third temperature can be greater than the first and second temperatures previously discussed in the oxidizing and chalcogenizing steps. For example, the first annealing can be performed at a third temperature ranging from about 550° C. to about 700° C., such as from about 575° C. to about 675° C., and such as from about 600° C. to about 650° C. The first annealing step can be performed for a period of preferably 5 or more minutes. Alternatively, the first annealing can be conducted at a lower temperature such as from about 475° C. to about 625° C., and such as from about 500° C. to about 600° C. The lower first annealing temperatures generally require longer annealing times, such as more than 10 minutes or more than 15 minutes. The partial pressure of the inert gas during the first annealing step can be less than about 500 Torr, such as less than about 300 Torr, and such as less than about 100 Torr.

A second annealing step can also be performed on the transition metal dichalcogenide (TMD) structure in presence of an inert gas such as nitrogen or argon, with or without the first annealing step. The second annealing step can be performed at a fourth temperature that is greater than that of the third temperature applied in the first annealing step. For example, the fourth temperature of the second annealing step can occur at a temperature of from about 600° C. to about 1000° C., such as from about 700° C. to about 900° C., and such as from about 750° C. to about 850° C. The second annealing step can be conducted for a period of, for example, from about 15 minutes to about 45 minutes, such as from about 20 minutes to about 40 minutes, and such as from about 25 minutes to about 35 minutes. The partial pressure of the inert gas during the second annealing step can be less than about 100 Torr, such as less than about 50 Torr, and such as less than about 10 Torr.

Figure 14:
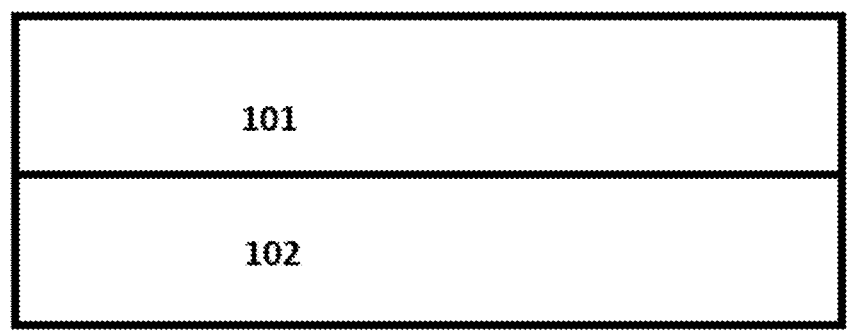
FIG. 14 shows a transition metal dichalcogenide (TMD) structure according to an embodiment of the present disclosure.

FIG. 14 shows a transition metal dichalcogenide (TMD) structure 100 according to an embodiment of the present disclosure. The TMD structure 100 can include a substrate 102 and a TMD layer 101. The TMD structure 100 can be formed using the transfer-free growth methods and materials described herein. For example, the TMD layer 101 can include molybdenum disulfide and the substrate 102 can be a silicon dioxide coated n-doped silicon ($SiO_2/n^+$-Si) substrate. The transfer-free growth process can result in the transition metal dichalcogenide (TMD) structure 100 having improved properties such as improved charge carrier mobility.

After the transition metal dichalcogenide (TMD) structure is formed, additional fabrication steps can be applied. For example, metal contacts can be applied on the substrate, such as at opposite ends of the transition metal dichalcogenide layer or window, and the metal contacts can be sintered in place. The transition metal dichalcogenide (TMD) structure can be adapted to form a diode with and without a gate contact, such as a tunable heterojunction diode, or a transistor, such as a field-effect transistor (FET).

The superior quality of the produced TMD can result in exceptional performance boosts in electronic, optoelectronic, and other applications such as physical and chemical sensing. With respect to the prior art, barristors of the present disclosure can have the greatest gate-controlled barrier height modulation for any graphene-based barristors due to the superior TMD material quality. For example, barristors of the present disclosure can exhibit a gate controlled barrier height modulation ranging from about 0.25 eV to about 0.90 eV. The barristors can also show very high optical sensitivity, caused by the wide tunability of the barrier height. For example, barristors of the present disclosure can have an optical sensitivity of 20 amperes per Watt (A/W) or greater. Further, the barristors can have high sensitivity to electron donating or accepting chemical analytes, which is enabled by the wide tunability of the barrier height. For example, barristors of the present disclosure can have electron donating or accepting chemical analyte detection of about 500 parts per billion or less, such as about 200 parts per billion or less.

A greater understanding of the embodiments of the present disclosure and their many advantages may be had from the following examples, given by way of illustration. The following examples are illustrative of some of the methods, applications, embodiments and variants of the present disclosure. They are, of course, not to be considered as limiting the scope of the present disclosure as numerous changes and modifications can be made.

Example 1

Top-down growth techniques were utilized for synthesizing large area molybdenum disulfide ($MoS_2$) transistors of a few monolayers in thickness. Patterns of molybdenum were oxidized to form mixtures of volatile molybdenum-oxides and the resulting films were thinned down by partial sublimation at a low temperature. Sulfur vapor was then introduced to the system to sulfidize the volatile oxides to molybdenum disulfide, also at a relatively low temperature (<650° C.). One advantage of the low growth temperature is that it avoids contamination of $SiO_2$ with diffused sulfur atoms, which allows the as-grown films to be used without transferring to different substrates, while maintaining high performance transistor characteristics on $SiO_2$ substrates.

The high quality $MoS_2$ samples were grown on 50 nm $SiO_2/n^+$-Si commercial substrates. A lithographic process was first performed to open up sub-mm sized rectangular windows on a clean $SiO_2/Si$ sample and a layer of molybdenum (Mo) was applied, followed by the electron beam evaporation and lift-off of a 7-10 nm thick layer of Mo. This original layer, if fully sulfidized, would have led to a more than 20 monolayers (MLs) of $MoS_2$. However, 7-10 nm was the minimum thickness required to form a continuous film on $SiO_2$, necessitating the post-growth thinning described below. The sample was placed on a quartz boat inside the high temperature region of a two-zone horizontal tube furnace. Ten (10) mg of sulfur powder (FISHER SCIENTIFIC®, 99.99% purity) was placed on a quartz plate in the colder region of the process tube.

The tube was pumped down to rough vacuum and purged with ultra-high purity (UHP) $N_2$ before the growth started. The synthesis process was completed in three steps and a pictorial representation of the process is provided in FIG. 1(a). The first step was to oxidize the Mo sample at 350-400° C. for 25-30 minutes in a low $O_2$ flow (approximately 5 sccm) before sulfidation to form volatile Mo-oxides, and thin down the Mo-containing film by partial sublimation. In step two, the hot zone temperature was raised to 450-500° C. and the cold zone temperature was elevated to 125-135° C. to allow the melting and evaporation of sulfur while the $O_2$ flow was gradually tapered off. No carrier gas was flowed during this step for approximately 50 minutes, during which the sulfur vapor reacted with the $MoO_x$ and formed $MoS_2$. In the final step, the cold zone temperature was reduced below the melting point of sulfur to quench the sulfidation, while the hot zone temperature was quickly raised to 625° C. for 10 more minutes, with a high flow of dry $N_2$ to improve the crystal quality, complete the sulfidation reaction, and remove the residual sulfur vapor from the reactor. Finally, the entire furnace was slowly cooled down to room temperature (at approximately −15° C./min) in presence of the same $N_2$ flow. The sample was then taken out from the chamber and was annealed in a separate process tube at 1000° C. in $N_2$ ambient for 30 minutes to improve crystallinity and electronic properties. Metal contacts, Ti/Au of 20/80 nm thicknesses formed by lift-off, were sintered at 350-400° C. for 60 minutes in $N_2$ ambient.

Figure 1B:
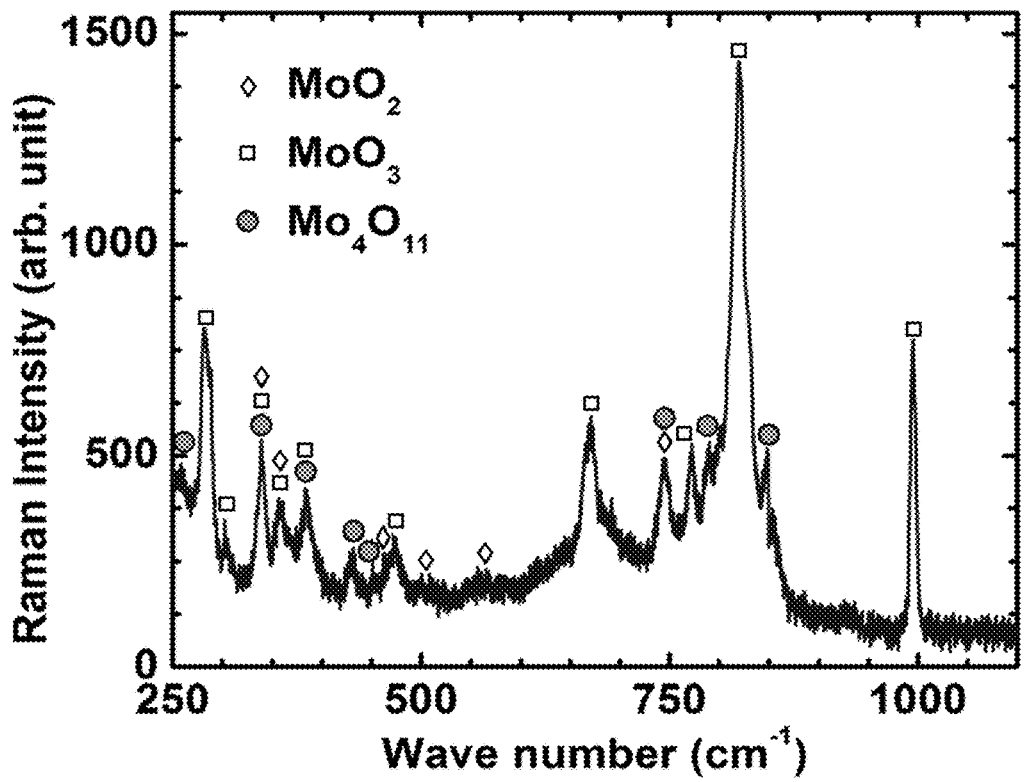
FIG. 1(b) is a graph illustrating the Raman spectra of partially oxidized pre-growth molybdenum samples showing peaks for various molybdenum oxides produced according to an example method of the present disclosure.

The initial low temperature baking of the sample in the presence of $O_2$ (first step of the growth process) forms various volatile oxides of Mo, as confirmed by the Raman spectra of a sample that was taken out of the chamber after the initial oxidation phase. The spectra, as shown in FIG. 1(b), indicates characteristic peaks of $MoO_2$, $MoO_3$, and an intermediate Mo-oxide, $Mo_4O_{11}$. The Mo was oxidized using only trace amounts of $O_2$ flow at a low temperature, which formed poor quality, oxygen-deficient oxides with chemically active sites and dangling bonds, leading to the mixed oxides observed.

Figure 1C:
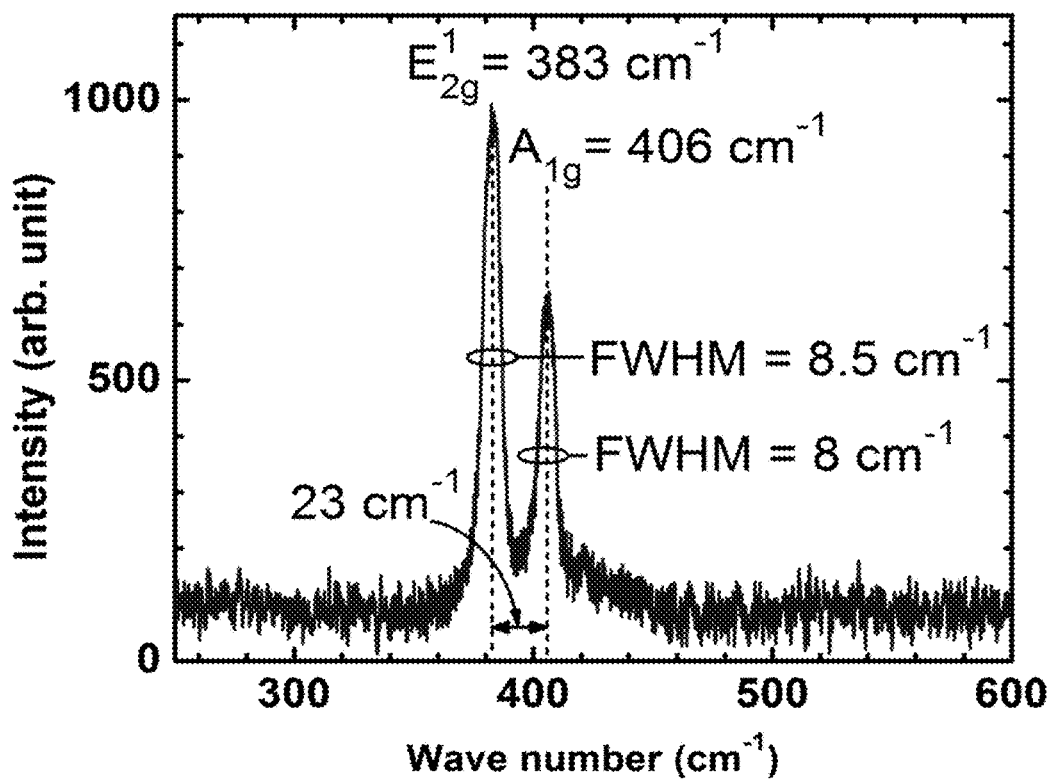
FIG. 1(c) is a graph illustrating the Raman spectra of a fabricated molybdenum disulfide ($MoS_2$) structure according to an embodiment of the present disclosure.
Figure 1D:
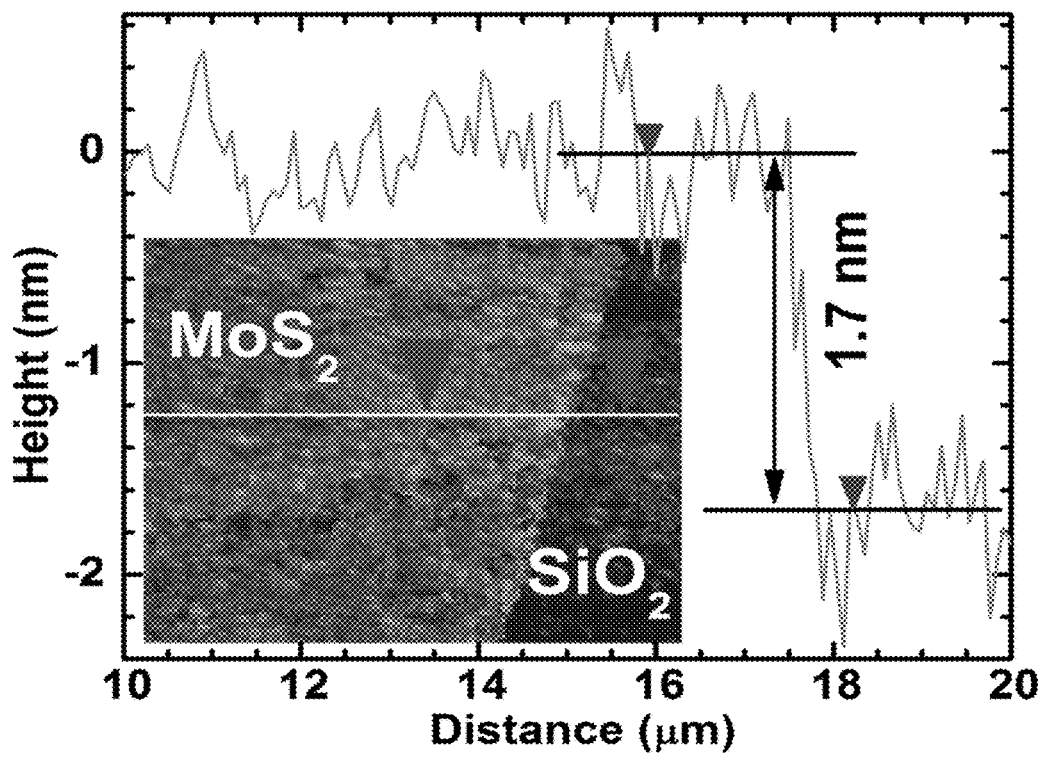
FIG. 1(d) is a graph of surface morphology of a fabricated $MoS_2$ structure according to an embodiment of the present disclosure.

The Raman spectra of the optimized as-grown $MoS_2$ sample is shown in FIG. 1(c), where the characteristic $A_{1g}$ and $E^1_{2g}$ peaks are observed to be separated by 23 $cm^{-1}$, indicating 3-5 ML thick $MoS_2$ (2-3 nm). The Mo-oxide peaks shown in FIG. 1(b) disappeared entirely after the sulfidation process, which indicates complete conversion of Mo-oxides to $MoS_2$. The reduction of thickness during the growth process (from 7-10 nm Mo to 3-5 ML $MoS_2$) is attributed to the sublimation of the volatile $MoO_x$ during the onset of sulfidation. A tapping mode atomic force microscopy (AFM) image taken on a VEECO® DI3000 AFM is also shown in FIG. 1(d) which shows a film thickness of 1.7 nm and root mean square surface roughness of <0.4 nm.

Figure 2A:
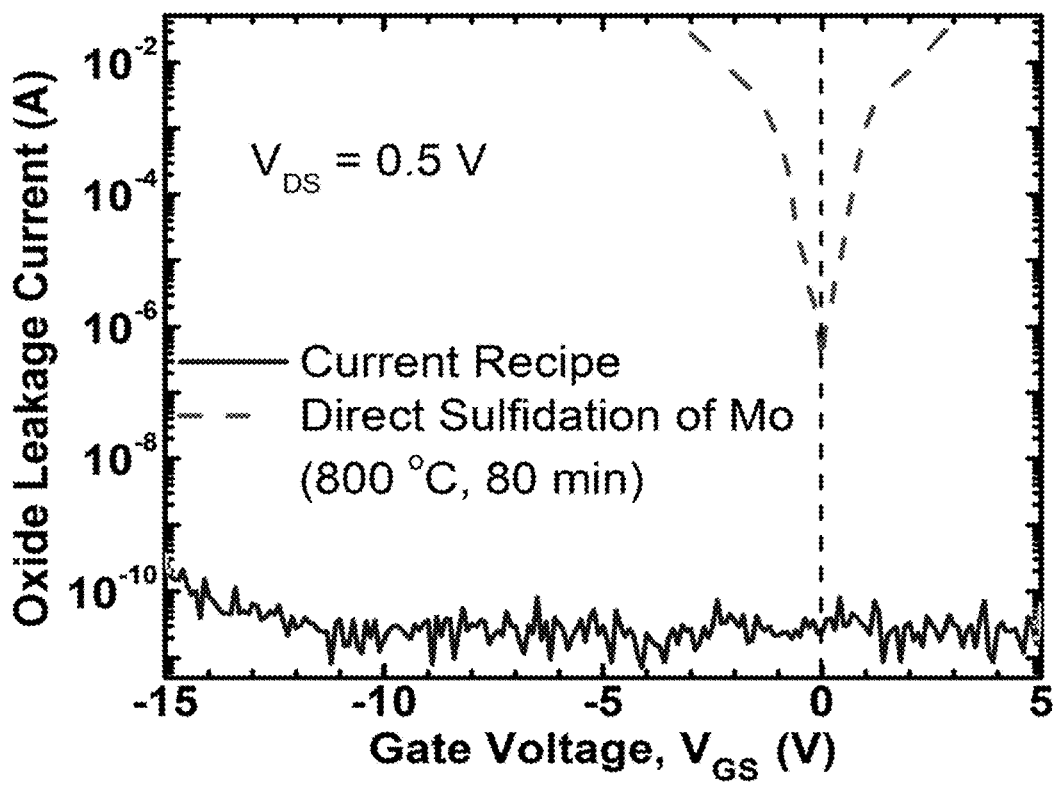
FIG. 2(a) is a graph illustrating the magnitude of gate leakage current through a sulfur dioxide structure according to an embodiment of the present disclosure.

To further demonstrate the usefulness of the proposed multi-step growth process, a comparison was made with a direct sulfidation method where the first two steps of the growth (oxidation at <400° C. and sulfidation at <500° C.) were skipped and a higher temperature (700-800° C.) was used for the single step sulfidation process. Due to the absence of the growth-time thinning process, a much thicker $MoS_2$ film was formed with several serious drawbacks: (1) thicker $MoS_2$ had to be thinned and (2) the $SiO_2$ was irreversibly damaged due to the exposure to elemental sulfur vapor at high temperatures (FIG. 2(a)). While laser ablation, plasma treatment, and thermal annealing have been shown to effectively thin the $MoS_2$, the $MoS_2$ film cannot be used until it is transferred to a fresh $SiO_2$/Si substrate due to film degradation. Thus, by reducing the sulfidation temperature through a pre-oxidation step instead of using the direct sulfidation method (longer duration at higher temperature), the gate leakage current was reduced by as much as $10^8$, while simultaneously limiting the thickness to <5 ML, with a bandgap of 1.4 eV. The gate leakage current was much less than the drain current for all gate voltages (FIG. 3c), showing that the gate breakdown was effectively suppressed. Since both samples shown in FIG. 3(c) had identical substrates to begin with, this comparison clearly shows that the proposed method preserves dielectric quality better than the others.

Figure 2B:
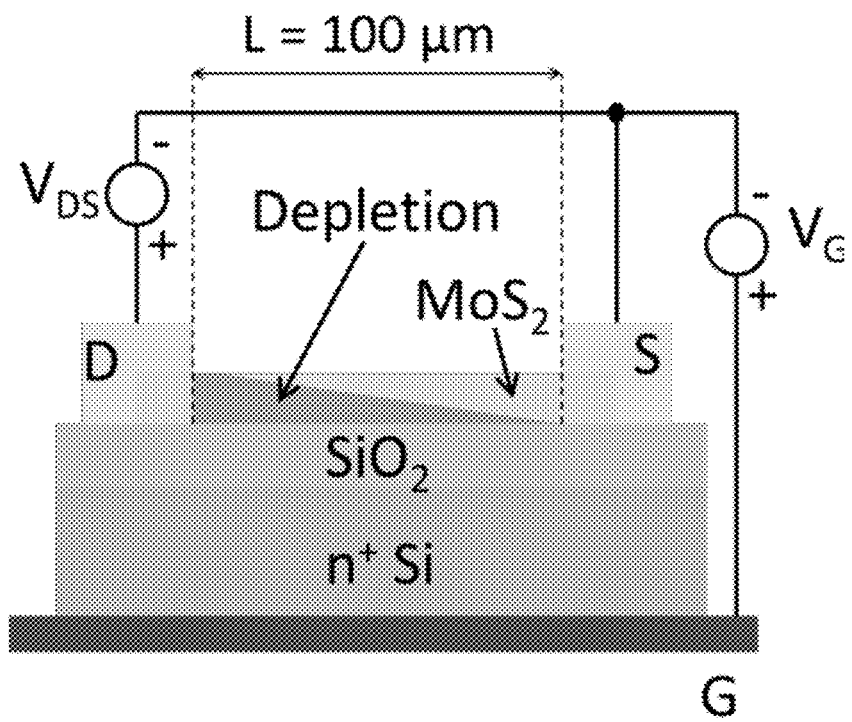
FIG. 2(b) shows the electrical test configuration and the pinching-off of the channel by the depletion region in a device according to an embodiment of the present disclosure.

The $MoS_2$ based back-gated FET's were characterized on a probe station with a temperature controlled chuck (300-500K) to study the effect of temperature on the current-voltage (I-V) characteristics using an AGILENT® B2902 source measuring unit (SMU) and capacitance-voltage (C-V) characteristics using a HP4284A® precision LCR meter. A schematic of the device structure is given in FIG. 2(b).

Figure 2C:
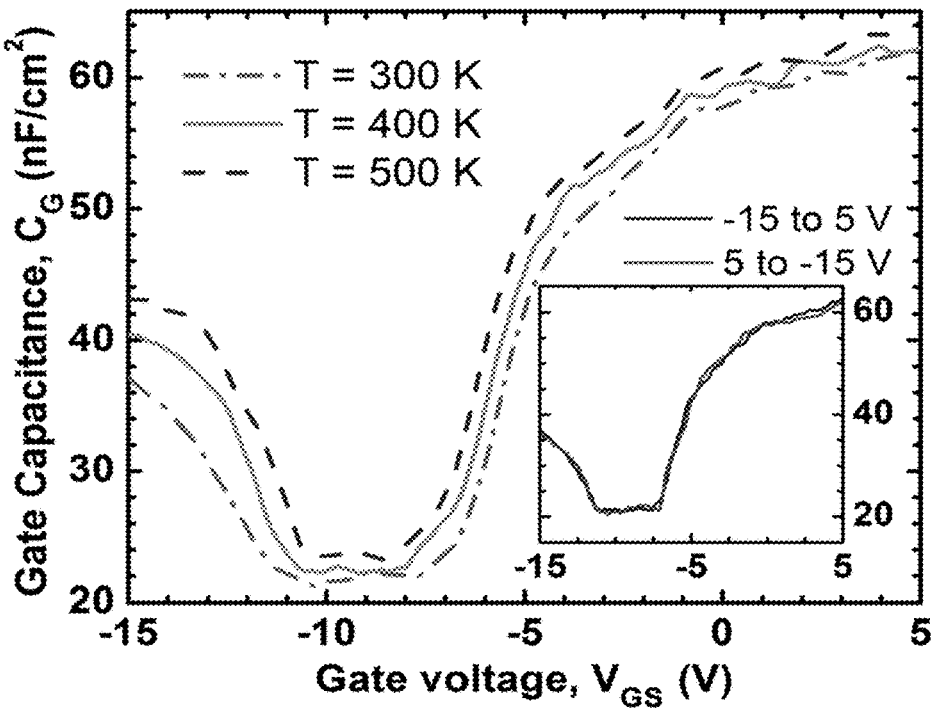
FIG. 2(c) is a graph illustrating gate capacitance-voltage (C-V) characteristics of a $MoS_2$ FET according to an embodiment of the present disclosure.

FIG. 2(c) shows the measured field-effect transistor (FET) capacitance, $C_{FET}$ vs $V_{GS}$ curves for temperatures 300-500K at 1 kHz, demonstrating the shape of a classical metal-oxide-semiconductor (MOS) capacitor. For $V_{GS}>0$ V, there is an accumulation of electrons, while $V_{GS}<0$ V causes the channel to be depleted of free electrons, eventually causing strong inversion below −12V. $C_{FET}$ accumulation approaches a value of approximately 0.064 μF/cm², corresponding to an oxide thickness ($t_{ox}$) of about 54 nm, consistent with the nominal value of 50 nm. In inversion, the $C_{FET}$ approaches a value approximately 60% smaller because of the series resistance seen by the holes in inversion, which agrees with the limited drain current in inversion (FIGS. 3(a)-(c)), as well as the band structure. The residual oxide capacitance per unit area ($C_{ox}$) for $-10.5V<V_{GS}<-7V$ is due to the limits of the measurement setup. The small increase with temperature is due to the contacts becoming more conductive, reducing the series resistance in the circuit, again consistent with the I-V characteristics below. The inset of FIG. 2(c) shows the C-V curves at 300 K with back and forth sweeping of the $V_{Gs}$, where the identical curves for both sweep directions indicate the absence of hysteresis.

Figure 2D:
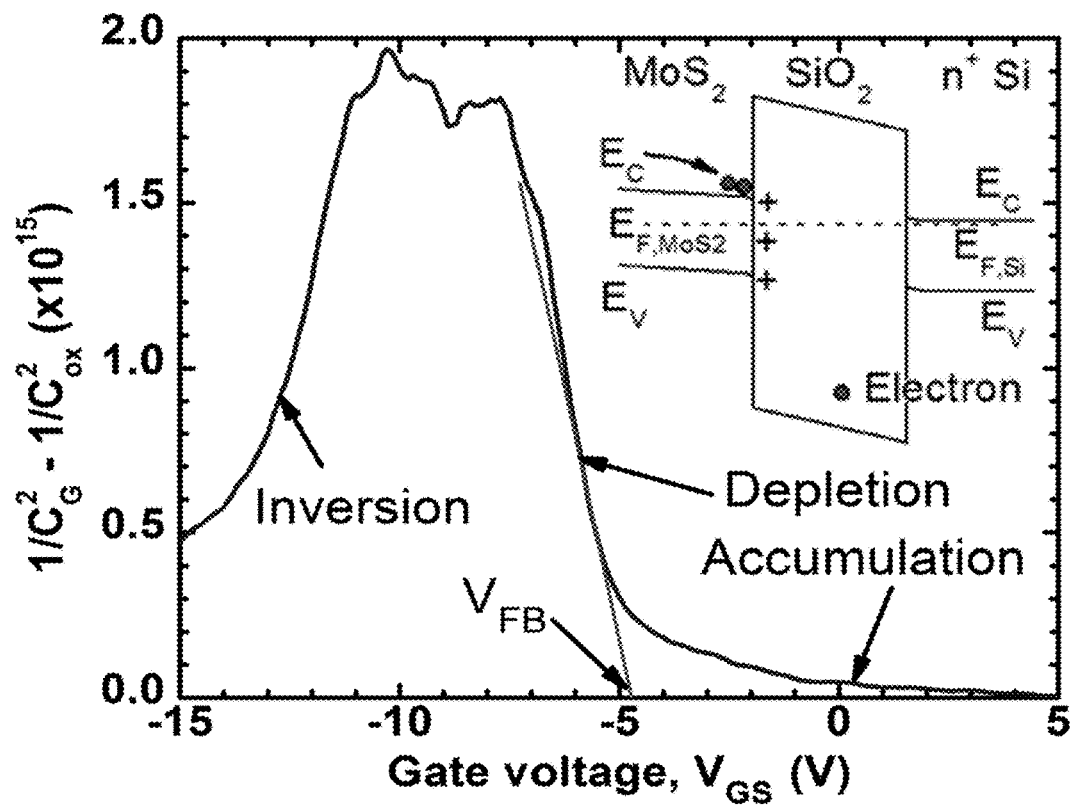
FIG. 2(d) is a graph illustrating inverse-squared gate capacitance-voltage ($1/C^2$-V) characteristics of a $MoS_2$ field-effect transistor (FET) according to an embodiment of the present disclosure.

Flatband voltage ($V_{FB}$) was determined using the following relation:

$$\frac{1}{C_G^2} = \frac{1}{C_{ox}^2} + k(V_{GS} - V_{FB}) \quad (1)$$

where k is a constant depending on the unintentional doping concentration and dielectric constant of $MoS_2$. In FIG. 2(d), $1/C_G^2 - 1/C_{ox}^2$ is plotted as a function of $V_{Gs}$ and a linear fit was applied at the depletion region. The $V_{FB}$, marked by the X-axis intercept of the fitting line, is estimated to be $-4.8\pm0.2$ V. This $V_{FB}$ shows a significant shift from the −1 V value estimated from the work function difference between $MoS_2$ and Si. This shift in voltage can be attributed to positive interface charges, the density of which is calculated by, $n_{int}=\Delta V_{FB} C_{ox}/q \approx 2\times10^{12}$ cm$^{-2}$. The charges are considered to be fixed charges, and not traps, since no hysteresis was observed in the I-V nor in C-V. This $n_{int}$ is very low for a non-native oxide-semiconductor interface, where even for native interfaces, $n_{int}$ can approach $10^{13}$ cm$^{-2}$. The corresponding equilibrium band diagram is shown in the inset of FIG. 2(d). These charges are attributed to this transfer-free growth process, and are crucial to describing the I-V characteristics below.

Figure 3A:
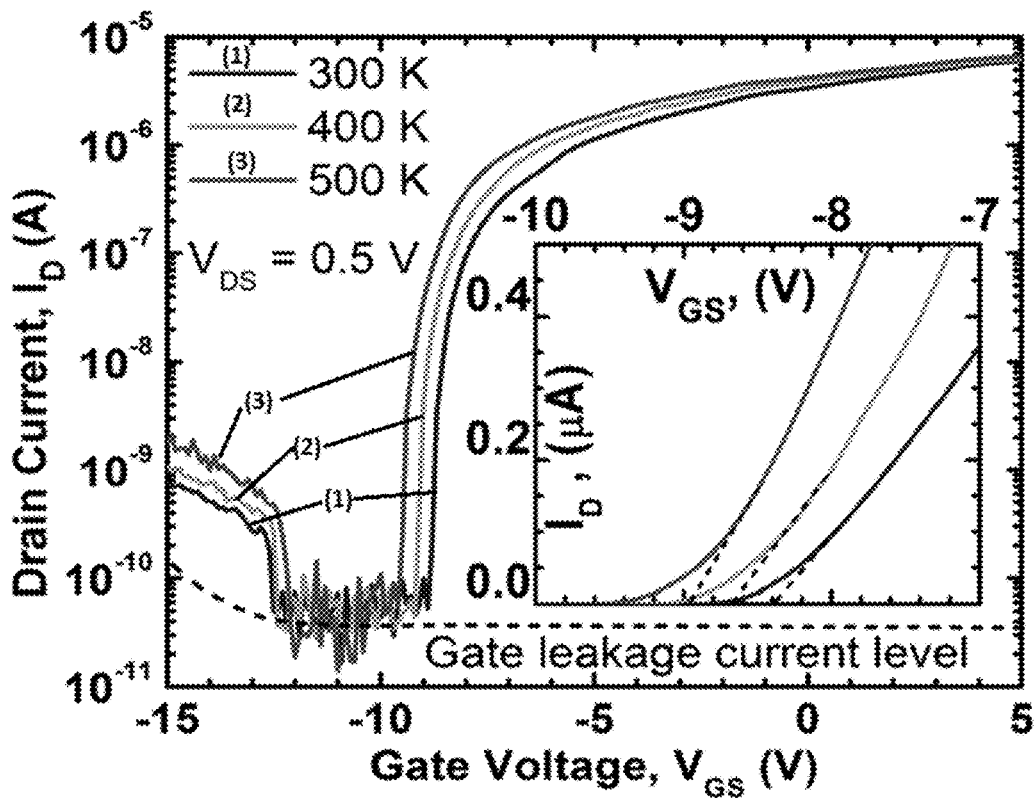
FIG. 3(a) is a graph illustrating transfer characteristics for an $MoS_2$-based FET produced using example methods of the present disclosure.
Figure 3B:
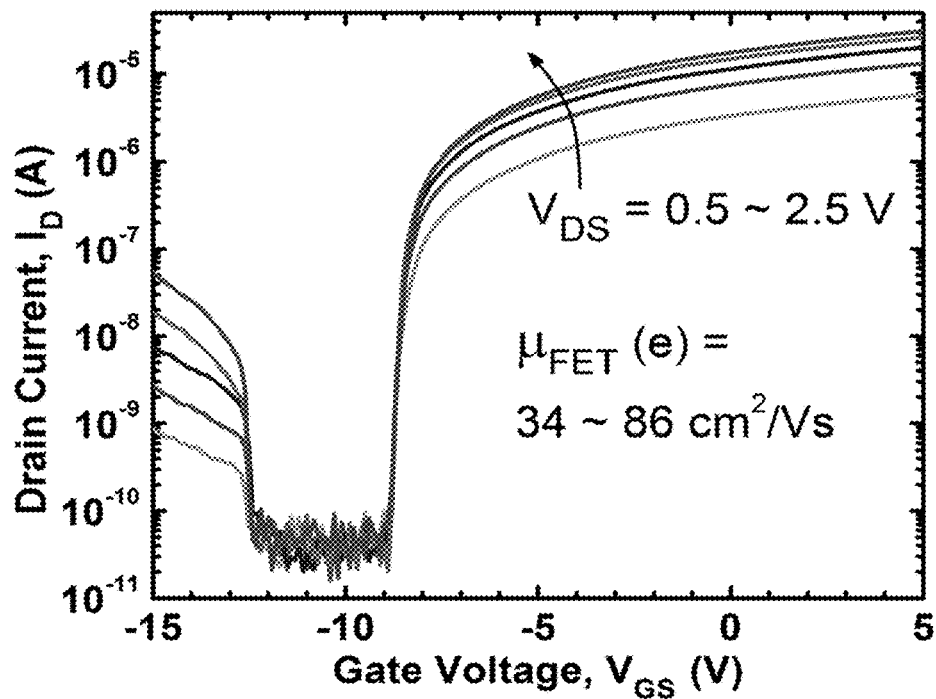
FIG. 3(b) is a graph illustrating transfer characteristics for an $MoS_2$-based FET produced using example methods of the present disclosure.
Figure 3C:
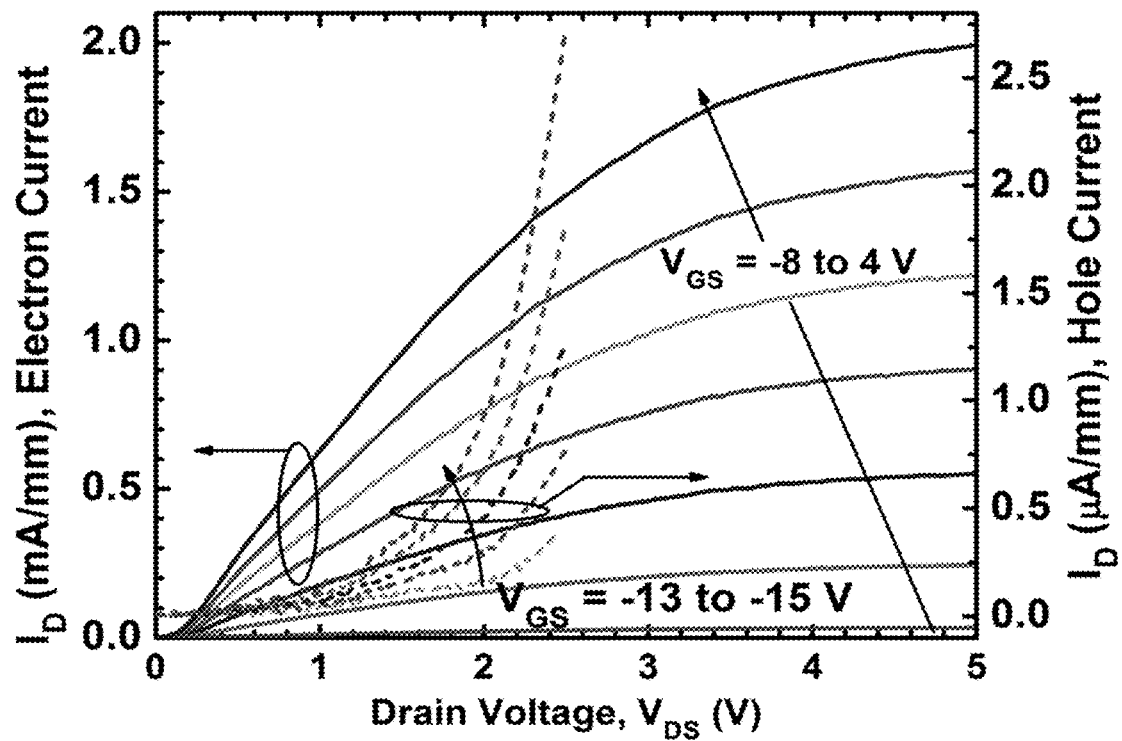
FIG. 3(c) is a graph illustrating normalized drain current and gate voltage ($I_D$-$V_{DS}$) characteristics for an $MoS_2$-based FET produced using example methods of the present disclosure.

FIG. 3(a) shows the transfer characteristic at $V_{DS}=0.5$ V, where the FET is in the triode region for all ranges of $V_{GS}$ (FIG. 3(c)). The linear plots of $I_D$, as shown in the inset of FIG. 3(a), were used to determine the threshold voltages ($V_T$). At $V_{GS}=0V$, the transistor is normally on, showing electron conduction in accumulation, with a threshold voltage ($V_T$) of about −8.8 V, and an ON/OFF ratio of about $10^5$. The accumulation subthreshold swing (SS) was 84 mV/decade which very good for synthetic $MoS_2$ devices, indicating the robustness of the gate dielectric to the growth process. The field effect mobility $\mu_{FET}$, is estimated from the linear FET characteristics:

$$\mu_{FET} = \frac{g_m L}{W V_{DS} C_{ox}} \quad (2)$$

where the transconductance $g_m = \partial I_D / \partial V_{GS}|_{VDS=0.5 V}$, L is the channel length, W the width of the FET, while $C_{ox}$ is the oxide capacitance per unit area. Here, the $C_{ox}$ measured in FIG. 2(c) and some representative $g_m$ vs $V_{Gs}$ curves are provided in the Supplementary Material, from which $\mu_{FET}=84$ cm²/V·s is estimated at accumulation, which decreases weakly with temperature (FIG. 3(d) inset). The weak temperature dependence was attributed to the canceling of the ionized impurity scattering ($\mu_{FET}$ increases with T), with phonon scattering ($\mu_{FET}$ decreases with T). The threshold voltage ($V_T$) also decreases with temperature at a rate of approximately 4 mV/K, consistent with the calculations for thick oxide MOSFET's.

FIG. 3(b) shows the transfer curves measured at varying drain-to-source voltages ($V_{DS}$) at 300 K. As $V_{DS}$ increases from 0.5 V to 2.5 V, the electron mobility increases. FIG. 3(c) shows the $I_D$ vs $V_{DS}$ family of curves for $-8 V<V_{GS}<4$ V in accumulation, and $-13 V<V_{GS}<-15$ V in inversion, where the current is normalized by gate width (20 μm). The first set of curves (solid lines, up to $V_{DS}=5$ V) are for $V_{GS}>V_T$, where $V_T$ is the threshold voltage of the FET, located at around −8.5 V. These curves have two distinct regions: a typical linear triode regime followed by a saturation regime that varies with $V_{GS}$. For a channel with only a few atomic layers, this device carries a large amount of current (>1 mA/mm), limited by the contact resistance of 1-4 kΩ which was measured by transmission line model (TLM) measurements. The maximum electric field in the channel is calculated to be less than 500 V/cm at $V_{DS}=5$ V, which is far smaller than the critical field for $MoS_2$. As a result, the drift velocity is calculated out to be approximately $10^4$ cm/s, using the carrier concentration obtained from C-V, and the extracted $\mu_{FET}$.

Figure 3D:
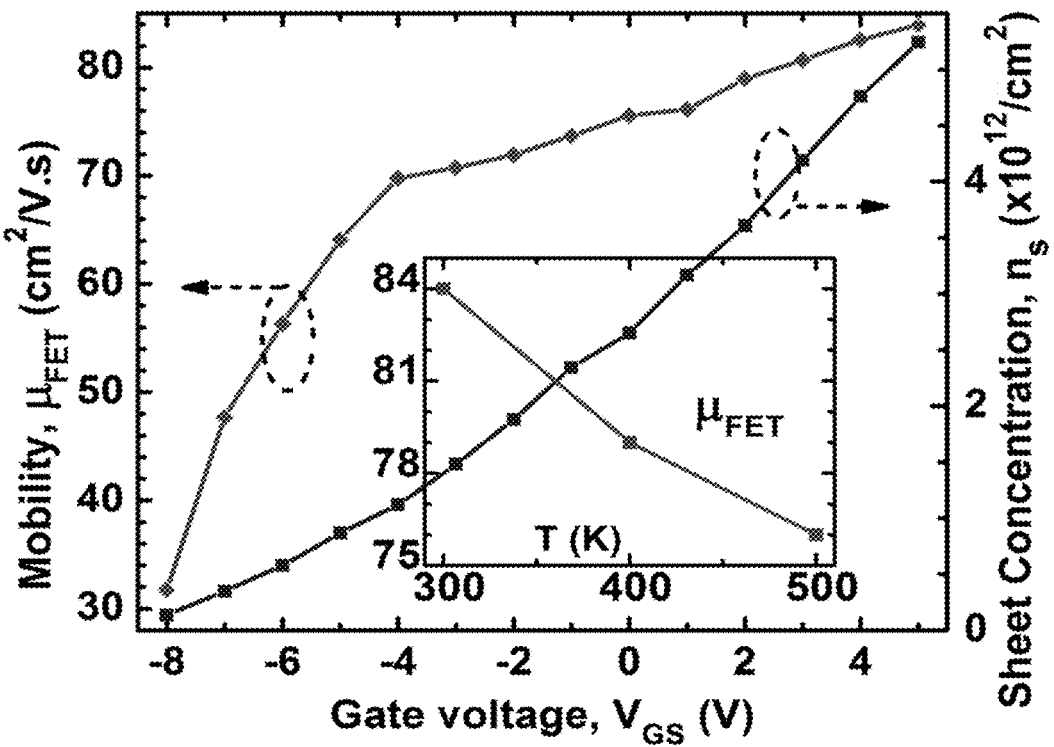
FIG. 3(d) is a graph illustrating the field effect mobility ($\mu_{FET}$) and sheet carrier concentration ($n_s$) of an $MoS_2$ FET produced using example methods of the present disclosure.

The mobility in saturation under accumulation is extracted from the fit to FIG. 3(d) with:

$$I_{DS} = \frac{1}{2}\frac{W}{L}\mu_{FET,sat}C_{ox}(V_{GS}-V_T)^2 \quad (3)$$

from which a $\mu_{FET,sat}$ of approximately 20-25 cm$^2$/V·s was obtained for $V_T$ approximately −8.5 V, in agreement with the $\mu_{FET}$ value near pinch-off (FIG. 3(d)). The quadratic dependence of $I_{DS}$ with $V_{GS}$, along with the low carrier velocity (approximately 10$^4$ cm/s), indicates that current saturation in these FETs is due to charge control and pinch off near the drain-end, as seen in long-channel metal-oxide semiconductor field-effect transistor (MOSFETs). This is in contrast to velocity saturation seen in short channel high-electron-mobility transistor (HEMTs), which would exhibit a linear dependence of saturation current on $V_{GS}$. At large $V_{DS}$, deep in saturation, there is a region of depletion at the drain-end. However, free carriers injected from the accumulation channel near the source end are swept across the depletion region by the electric field, and the current remains nearly constant.

The second regime of $V_{GS}$ shown in FIG. 3(c) is indicative of inversion current, i.e. hole transport, as opposed to electron transport. A high degree of non-linearity is observed in the $I_D$-$V_{DS}$ curves which is attributed to the large rectifying Schottky barrier (>1 eV) to the hole transport at the D-S contacts (FIG. 4).

In FIG. 3(d), field-effect mobility ($\mu_{FET}$) is shown as a function of $V_{GS}$ at $V_{DS}$=0.5 V. Field-effect mobility ($\mu_{FET}$) increases with $V_{GS}$, as the interface charges are screened by the field-effect induced electrons in accumulation, increasing from approximately 32 cm$^2$/V·s near depletion to approximately 84 cm$^2$/V·s in accumulation with a channel carrier density of <10$^{13}$ cm$^{-2}$. The lowered effective mobility in saturation, due to the reduced screening of charged impurity scattering at the pinched-off drain-end, supports the presence of this mobility-limiting mechanism. The small increase of current with temperature is also consistent with this assessment. The values of $\mu_{FET}$ at $V_{DS}$=0.5 V were used to calculate sheet carrier concentration ($n_s$) in FIG. 3(d), using Jt=qn$_s$µE$_{DS}$, where J is current density obtained from I-V measurements at $V_{DS}$=0.5 V and t is the average thickness of the film. The drain to source electric field was estimated to be approximately 50 V/cm at $V_{DS}$=0.5 V.

Figure 4A:
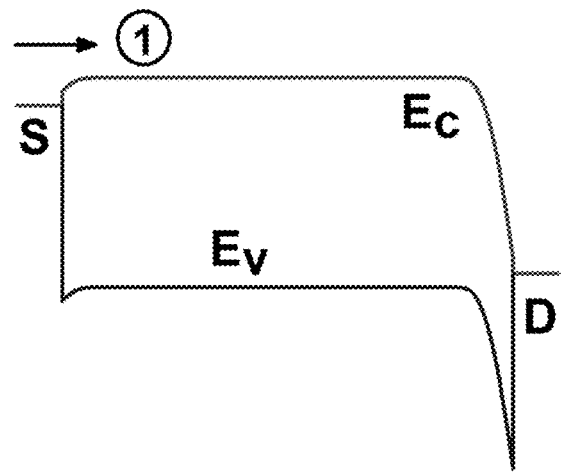
FIG. 4(a) shows an energy band diagram of an $MoS_2$ FET produced using example methods of the present disclosure.
Figure 4B:
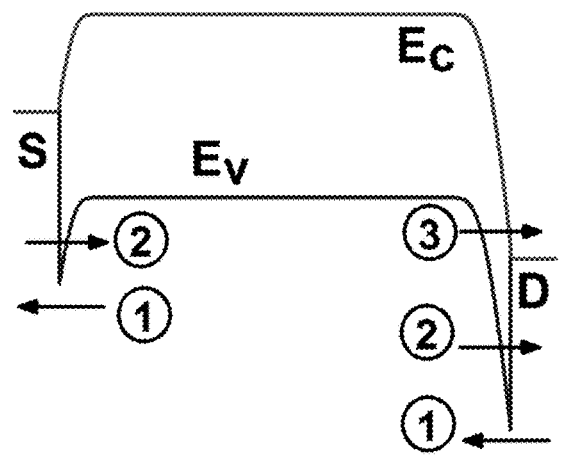
FIG. 4(b) shows an energy band diagram of an $MoS_2$ FET produced using example methods of the present disclosure.

FIG. 4 shows the non-equilibrium energy band diagrams along the transport direction at low $V_{DS}$ for electron transport (FIG. 4(a)) and hole transport (FIG. 4(b)). Since the MoS$_2$ Fermi level is pinned to the metal Fermi level and the contacts are made of annealed Ti/Au, which forms ohmic contacts to MoS$_2$, at thermal equilibrium there is a significantly smaller barrier in the conduction band (E$_C$) than in the valence band (E$_V$). Therefore, at ON-state of the device ($V_{GS}$>>$V_T$), electrons are injected/extracted by the source/drain contacts very efficiently. At low $V_{DS}$ (<1 V), band to band tunneling (BTBT) of electrons from the drain contact to the MoS$_2$ E$_V$ is unlikely due to the E$_V$ being at a lower energy level than the drain Fermi level (FIG. 4(a)), hence thermionic emission is the only mechanism of carrier injection at this regime which resulted in a maximum mobility of >80 cm$^2$/V·s. The situation changes when $V_{GS}$ becomes significantly lower than $V_T$ and the channel experiences strong inversion. Then, there are two tunnel barriers seen by the holes as shown in FIG. 4(b), which limits the hole current significantly. The possible hole transport mechanisms may be thermionic emission (low probability due to very high barriers), intra-band hole tunneling at the both ends of the channel, and band-to-band tunneling at the drain end. The highly non-linear behavior of the $I_D$-$V_{DS}$ curves at inversion (FIG. 3(c)) also indicates tunneling based mechanisms dominate in this regime. This asymmetrical transport behavior may be useful in developing CMOS TFT circuits using MoS$_2$ FETs, where choosing the right metal contacts could enhance the transport of either type of carrier while suppressing the other, leading to greater voltage discrimination between logic states.

TABLE 1

Comparison of device parameters with other works on exfoliated and synthetic MoS$_2$.

| Work | Thickness | Method of preparation | Gate | Dielectric | µ (300 K) cm$^2$/V · s | n$_s$ (cm$^{-2}$) | SS (mV/dec) | On/Off |
|---|---|---|---|---|---|---|---|---|
| This work | 3-5 ML | CVD-Mo* | BG | SiO$_2$ | >80 | <10$^{13}$ | 84 | 10$^5$ |
| Kim et. al. | 20-80 nm | exfoliated | BG | Al$_2$O$_3$ | 100 | (N$_D$) 10$^{16}$ cm$^{-3}$ | 80 | 10$^6$ |
| Chen et. al. | ML-12 nm | exfoliated | BG | BN/SiO$_2$ | 90-250 | 10$^{11}$-10$^{13}$ | — | — |
| Radisavljevic et. al. | ML | exfoliated | TG | HfO$_2$ | 55 | — | 74 | 10$^8$ |
| Fiori et. al. | few-ML | exfoliated | BG | SiO$_2$ | 23-26 | 2-5 × 10$^{12}$ | 850 | 10$^5$ |
| Lin et. al. | ML | exfoliated | TG | polymer | 150 | — | approximately 60 | 10$^6$ |
| Zhang et. al. | ML | CVD-MoO$_3$ | BG | SiO$_2$ | 0.23 | — | — | 10$^5$ |
| Zhan et. al. | ML-few ML | CVD-Mo | BG | SiO$_2$ | 0.04 | — | — | — |
| Lie et. al. | ML-few ML | CVD-(NH$_4$)$_2$MoS$_4$ | BG | SiO$_2$ | <10 | — | — | 10$^5$ |
| Laskar et. al. | ML-few ML | CVD-Mo** | — | — | <10 | (N$_D$) 3 × 10$^{20}$ cm$^{-3}$ | — | — |
| Schmidt et. al. | ML | CVD-MoO$_3$ | BG | SiO$_2$ | 45 | 7 × 10$^{12}$ | — | >10$^6$ |
| Lee et. al. | ML | CVD-MoO$_3$* | BG | SiO$_2$ | 0.02 | — | — | >10$^3$ |
| Lin et. al. | 2-3 ML | CVD-MoO$_3$ | BG | SiO$_2$ | 0.8 | — | — | 10$^5$ |

*does not involve transfer.
**does not involve transfer, grown on sapphire.

Table 1 compares the measured FET metrics with those of other MoS$_2$ devices, including small area and large area devices, most of which require a transfer to a fresh substrate. It can be seen that devices of the present disclosure represent state-of-the-art on SiO$_2$ dielectrics in air, with the advantage of a transfer-free process, which is highly desirable for high throughput processing with high yield.

In summary, new growth techniques for synthesizing top-down, large area, transfer-free 3-5 ML thick MoS$_2$ on SiO$_2$ were demonstrated, reducing gate leakage by >10$^8$.

Field-effect transistors (FETs) fabricated from these MoS$_2$ layers showed normally-on accumulation mode characteristics, with $\mu_{FET}$>80 cm$^2$/Vs, SS<90 mV/decade, and ON/OFF ratios of >10$^5$. The threshold voltage was shifted to −8.5 V, which was attributed to a fixed positive charge at the SiO$_2$/MoS$_2$ interface caused by the growth. The temperature stability of FET metrics up to 500 K was likely due to canceling of ionized impurity scattering and phonon scattering.

Example 2

Molybdenum disulfide (MoS$_2$) and other TMDs are analogous to graphene, a two-dimensional layer of carbon atoms in a graphite-like hexagonal lattice. The recent interest in the TMDs stemmed since the discovery of graphene and its exceptional properties, such as extremely high mobility, very high thermal conductivity, surface sensitivity to various molecules, etc. However, graphene based field effect transistors (FETs) perform poorly in terms of switching, owing to its zero band gap. It has been shown by many reports that forming a heterojunction with graphene and another semiconductor can often alleviate this particular problem, while adding a number of other benefits due to the presence of a non-negligible Schottky barrier at the hetero-interface. When the other semiconductor, used with graphene to form the heterojunction, is also a two-dimensional material, there is essentially a 2D heterojunction in place. A key property of these 2D heterojunctions is that each constituent of the heterojunction is so thin that it may not be able to completely screen an electric field from the second constituent. That is, the Debye screening length can be greater than the layer thicknesses, so that voltage-induced interfacial tuning is achievable. This capability is unique to thin layers, most practically achieved in 2D heterojunctions. A gate tunable version of this device structure allows modification of the Schottky barrier height (SBH) electrically, turning it into a Schottky barrier transistor (i.e. "barristor"). Analogous to a triode vaccum tube, this device may find applications in RF electronics, molecular sensing, photodetection, analog amplification and digital electronics, while offering all the perks of modern solid state technologies—high speed, lower power consumption, compact build and lower cost.

Figure 5A:
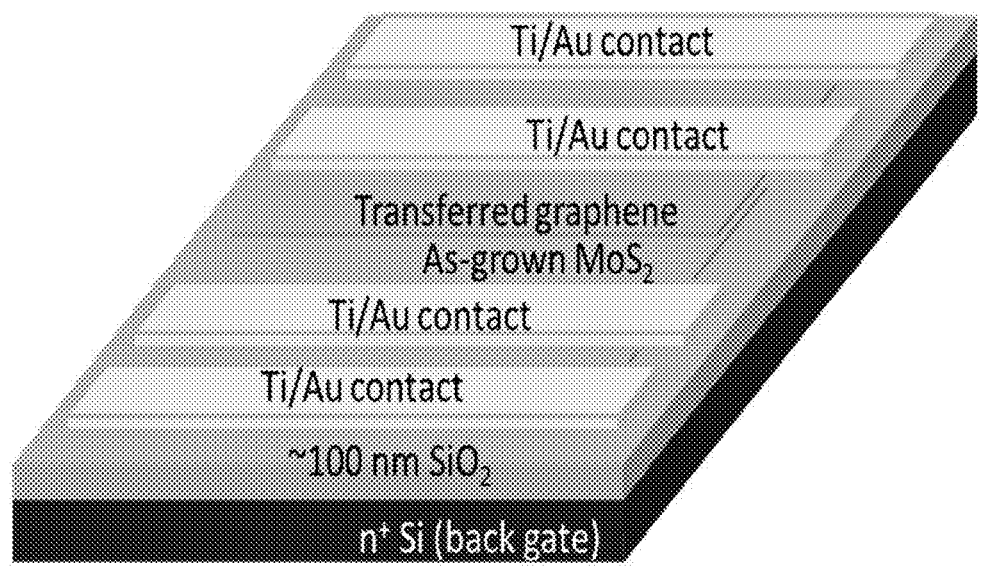
FIG. 5(a) shows a schematic diagram of a graphene/$MoS_2$ barristor produced using example methods of the present disclosure.
Figure 5B:
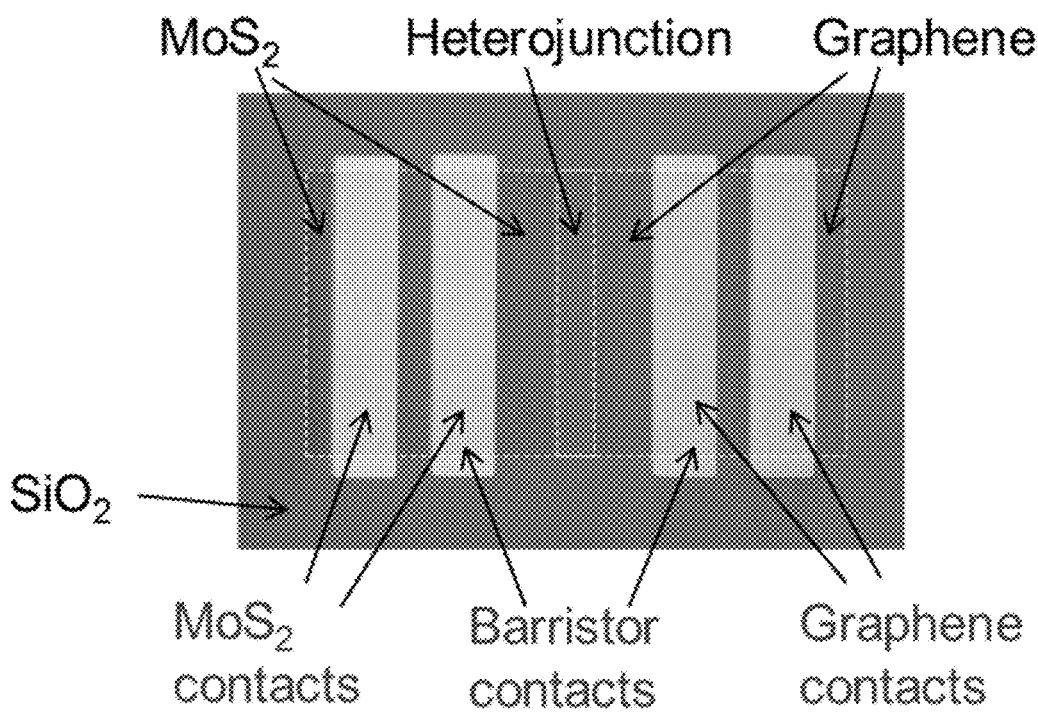
FIG. 5(b) shows an image (top view) of a graphene/$MoS_2$ barristor produced using example methods of the present disclosure.

As a second example, to demonstrate the superior material quality and device performance of the claimed oxygen-mediated MoS$_2$ synthesis method, the graphene/MoS$_2$ 2 D barristor device for electronic, optoelectronic and chemical sensing performances is investigated. For this purpose, high quality 3-5 ML (monolayers) MoS$_2$ samples were grown on 100 nm SiO$_2$/n$^+$-Si substrate by partial oxidation and subsequent sulfidation of Mo. Titanium/Gold (Ti/Au) metal pads were fabricated on specific areas to serve as contacts to MoS$_2$ and graphene patterns, followed by a 300° C. annealing in forming gas. High quality 1-2 ML graphene was grown separately on high purity Cu foils using CH$_4$/H$_2$ precursor gases at around 1000° C. in a tube furnace. The graphene/Cu bilayer was then coated with polymethyl methacrylate (PMMA) for mechanical stability, the Cu was then etched in FeCl$_3$ solution. After many rinses with HCl solution and deionized water, the PMMA/graphene bilayer was then transferred onto the as-grown MoS$_2$/SiO$_2$ sample. After removing the PMMA in acetone, the graphene film was patterned using O$_2$ plasma in a reactive ion etching (ME) system. A second layer of Ti/Au metallization with larger contact pads was performed on top of the annealed contacts for both MoS$_2$ and graphene to improve the contact resistance. FIG. 5 shows the (a) schematic and (b) optical microscopy images of the final device structure, where it can be seen that the four contacts allow measurements not only on the MoS$_2$/graphene heterojunction, but also on the MoS$_2$ and graphene films individually. A temperature controlled chuck and cryostat were used to study the effect of temperature on the I-V and C-V (at 100 kHz) characteristics of the devices.

Figure 6A:
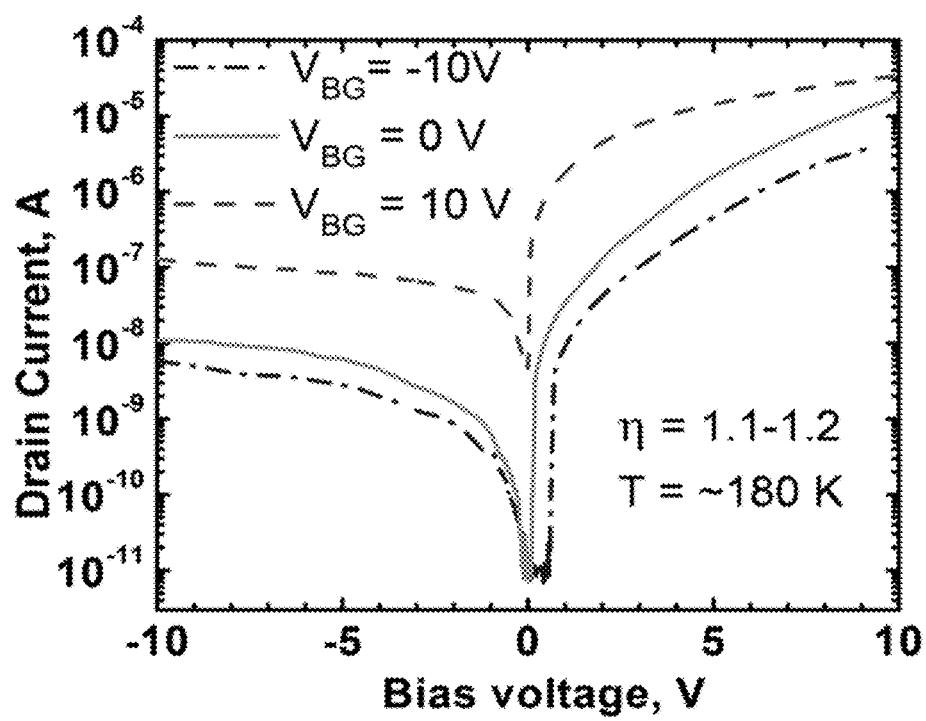
FIG. 6(a) is a graph illustrating current-voltage (I-V) characteristics for a graphene/$MoS_2$ based heterojunction fabricated using example methods of the present disclosure.

FIG. 6(a) shows the I-V curves for the MoS$_2$/graphene barristor for three different gate voltages, the measurements were taken at approximately 180 K temperature in a dark environment, with a graphene contact being used as the drain electrode. The current was >10$^3$ times lower in the reverse bias compared to the forward bias, demonstrating the clear rectifying behavior of the junction. The effective junction area of this device was 5×100 µm$^2$, and the distance between the edge of the junction and the MoS$_2$/graphene contact was 5 µm. Since MoS$_2$ is n-doped and graphene is p-doped at V$_{BG}$ (bandgap voltage)=0 V, V$_{BG}$<0 V will cause depletion in MoS$_2$ and accumulation in graphene, while V$_{BG}$>0 V will do the opposite.

The current through the heterojunction is controlled by the Schottky barrier height and ideality factor at small biases. For this particular measurement, it was found that the ideality η<1.3, which is reasonably good given the difficulties of forming a low-impurity interface between MoS$_2$ and graphene. The I-V measurements were repeated for gate voltages ranging between −20 V and +10 V, at different temperatures from 160 K to 350 K (with ±2 K accuracy). The reverse saturation current (I$_0$) was obtained by finding the Y-axis intercept of the log(I) vs V curves and expressed as current density, J$_0$. Using the thermionic emission model, the diode current is as follows:

$$J = J_0 \left[ \exp\left(\frac{qV}{\eta k_B T}\right) - 1 \right] \quad (4)$$

$$J_0 = A^* T^2 \exp\left(\frac{-q\Phi}{k_B T}\right) \quad (5)$$

The Richardson's coefficient (A*) is related to effective mass of electrons (m*) by:

$$A^* = 4\pi q k_B^2 m^*/h^3 \quad (6)$$

where, η is the ideality factor, k$_B$ is the Boltzmann's constant=1.3806×10$^{-23}$ J/K, h is Planck's constant=6.626× 10$^{-34}$ J·s, q is the electronic charge=1.609×10$^{-19}$ C, while Φ is the Schottky barrier height. Graphene is modeled as an equipotential semi-metallic surface with no significant drop of voltage and the small voltage drop across the MoS$_2$ film, partially overlapped by graphene for only 5 µm length, is also small especially at low injection. That is why, until the series resistance starts to dominate (diode fully on), the effect of such small potential difference can be ignored.

Figure 6B:
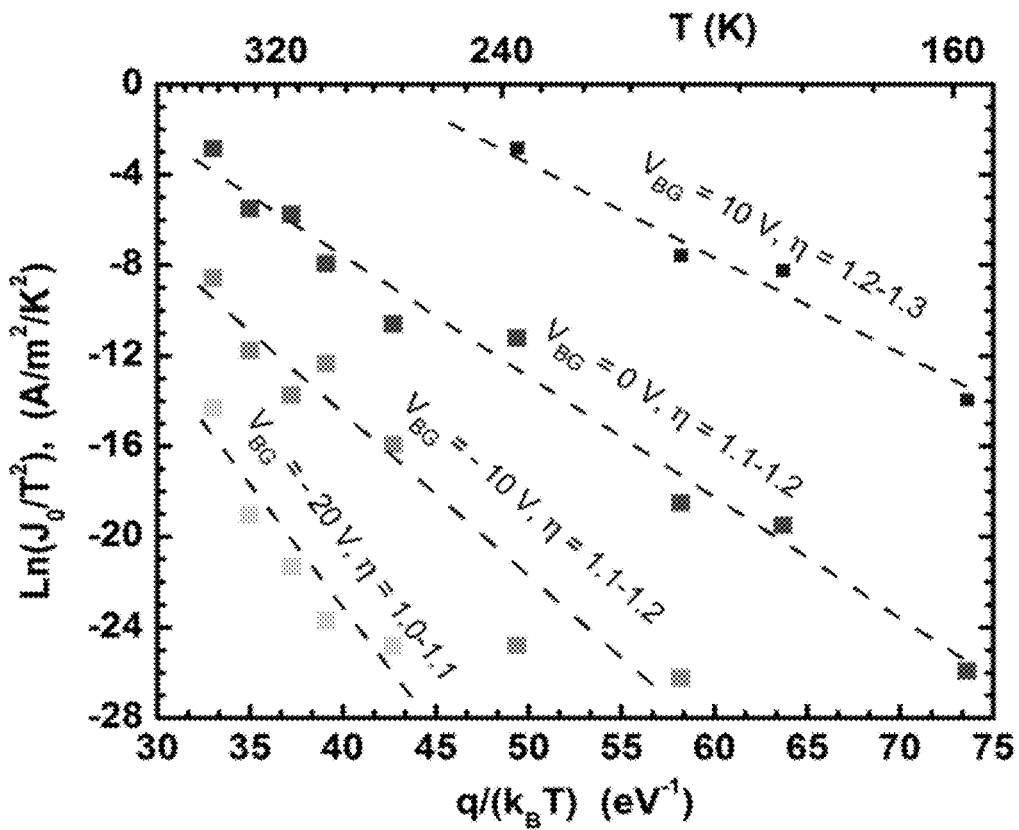
FIG. 6(b) is a graph illustrating Arrhenius plots for barrier height calculations of graphene/$MoS_2$ fabricated using example methods of the present disclosure.
Figure 6C:
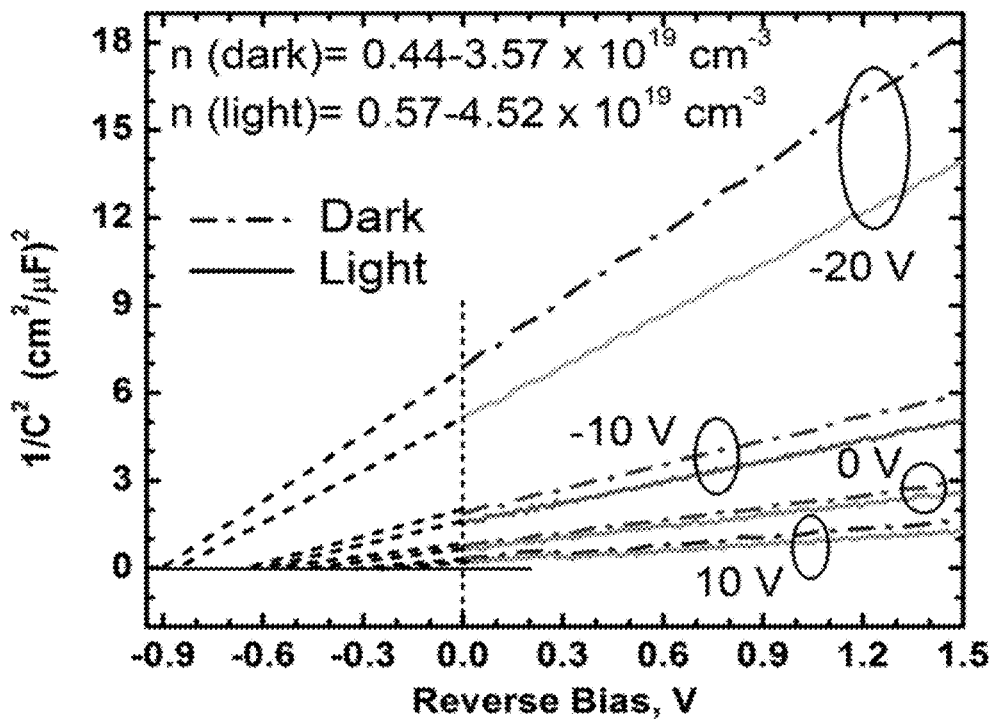
FIG. 6(c) is a graph illustrating optical responsivity via inverse-squared gate capacitance-voltage ($1/C^2$–V) characteristics of a graphene/$MoS_2$ barristor fabricated using example methods of the present disclosure.
Figure 6D:
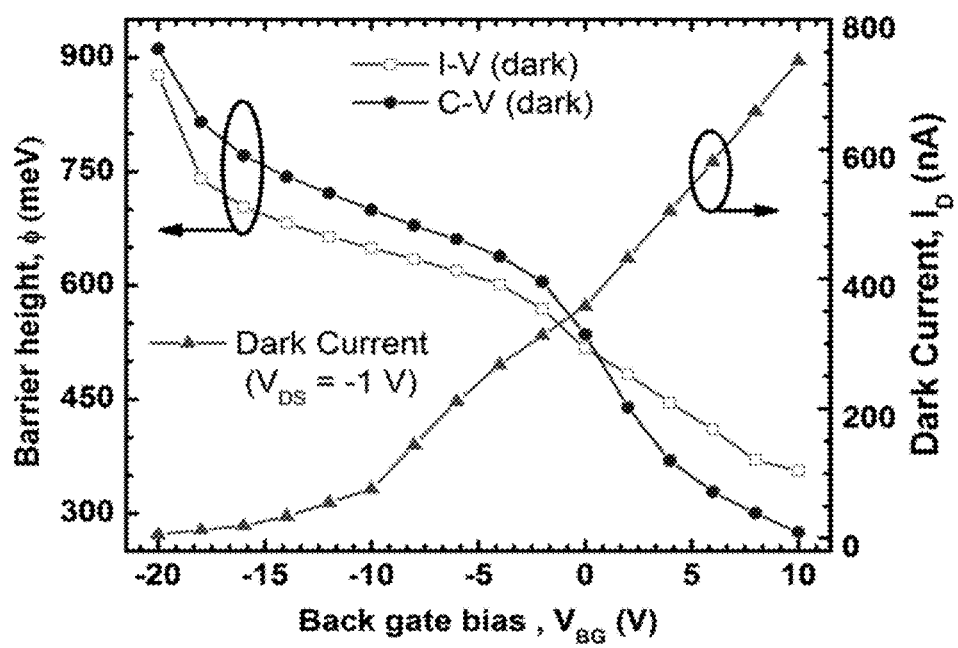
FIG. 6(d) is a graph illustrating variation of barrier height with gate voltage for a graphene/$MoS_2$ barristor fabricated using example methods of the present disclosure.

In FIG. 6(b), ln(J$_0$/T$^2$) vs q/(k$_B$T) is plotted and the linear fit for each gate voltage is shown (drawn through the data points for which η was less than 1.3). For V$_{BG}$=−10 V and −20 V, η<1.2 even for the high temperature measurements, and all data points matched closely with the linear fit. However, for V$_{BG}$=0 V and +10 V, the data points at higher temperatures started to show saturation behavior and η started to rise above 1.3 quickly. This can be attributed to the series resistance that played a dominant role in limiting the current at its already high value, and thus significantly increased the ideality factor. The slope of each fitted straight line indicates Φ, which is shown in FIG. 6(d). Also, the Y-axis intercepts of these fitted lines indicate the mean Richardson's coefficient $A^*=80.3\pm18.4$ A/cm$^2$/K and mean electron effective mass, and $m^*/m_0=0.66\pm0.15$ accurately describes the transport over all temperature and $V_{BG}$ ranges measured, supporting the starting assumption of thermionic emission (Equation 4).

Capacitance-voltage (C-V) measurements were also performed to estimate the Schottky barrier height between graphene and MoS$_2$, and the carrier concentration of MoS$_2$. The back-gate was used to modulate both parameters to demonstrate the barristor action, and the 1/C$^2$ vs reverse bias (MoS$_2$ contact used as the drain) plots are shown in FIG. 6(c). It can be seen that the 1/C$^2$ vs V plots are linear at the low bias ranges, which allows us to fit the curves to the following equation for an n-Schottky junction:

$$\frac{1}{C^2} = \frac{2}{q\varepsilon_{MoS_2}n}(\Phi - V) \quad (7)$$

where $\varepsilon_{MoS2}$=dielectric permittivity of MoS$_2$, and n=MoS$_2$ carrier concentration. Here the effect of illumination can be seen as well, which has a significant effect on the barristor, and will be discussed shortly. Using Equation 7, $\Phi$ and n can be estimated for various back gate biases, with and without illumination. A comparison was made of the $\Phi$ obtained from C—V and I-V measurements for gate voltages between −20 V and +10 V, and both measurement techniques revealed similar correlations between $\Phi$ and $V_{BG}$. For a positive gate bias, MoS$_2$ goes into accumulation mode, which is reflected by the increased $n_s$ along with a reduced barrier height with graphene. The opposite result is observed with the negative gate bias. The effective barrier height varied within 0.24-0.91 eV range, which is a range of approximately 600 meV, showing that current control over 10$^{10}$ may be possible. The presence of low intensity light (10 W/m$^2$) lowered the barrier by about 0.04 eV for all $V_{BG}$, and increase in n was also observed (FIG. 6(c)).

Figures 7A, 7B:
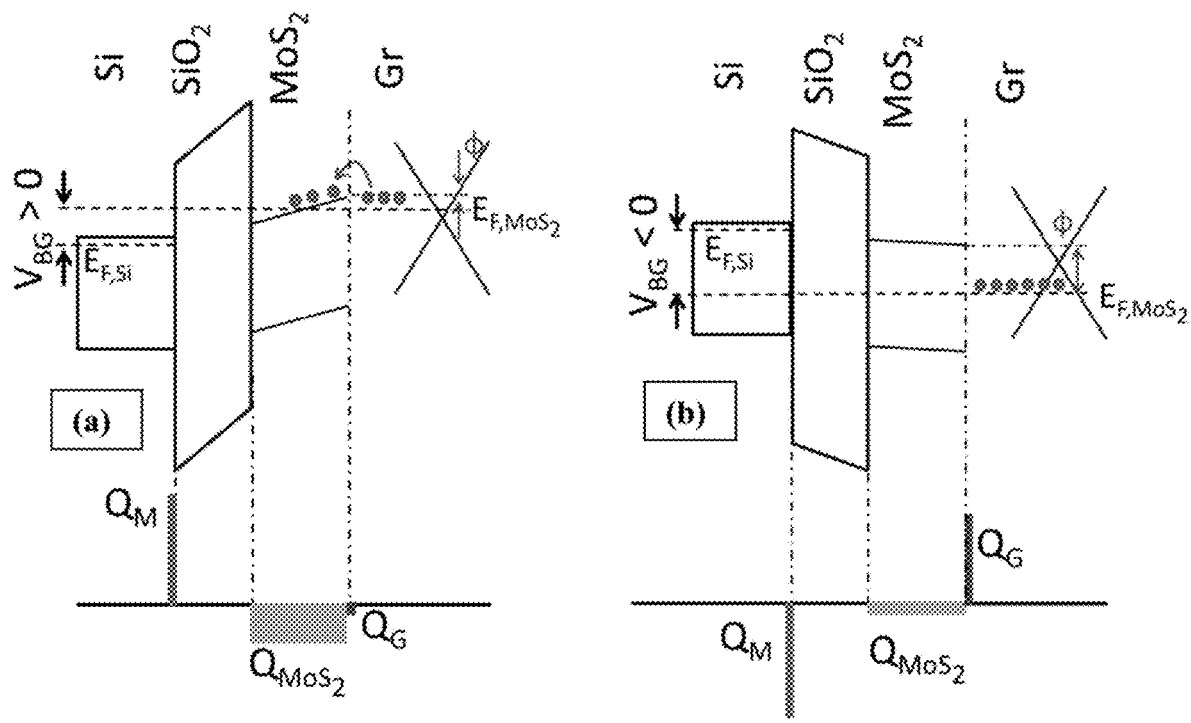
FIG. 7(a) is an illustration of an energy band diagram of a graphene/$MoS_2$ barristor structure produced using example methods of the present disclosure.
FIG. 7(b) is an illustration of an energy band diagram of a graphene/$MoS_2$ barristor structure produced using example methods of the present disclosure.

The extracted barrier heights in FIG. 6 correspond to the graphene/MoS$_2$ barrier heights only, as the metal/MoS$_2$ junction does not exhibit Schottky behavior as shown in the previous example with the MoS$_2$ FET. Based on the above results, the band diagrams and charge balance of the barristor device are shown in FIG. 7 for (a) $V_{BG}$>>0 V (b) $V_{BG}$<<0 V. The Schottky barrier is only considered at the graphene/MoS$_2$ junction as the metal/MoS$_2$ was ohmic. The key difference between the graphene/MoS$_2$ heterojunction and traditional Schottky structures is that the constituent materials of this junction are 2D materials, and are thus very thin. This leads to incomplete screening of the back-gate induced electric field in the bottom MoS$_2$ layer from the top graphene layer, leading to electric-field modulation in both components of the Schottky junction. Such functionality, enabled by incomplete field screening, is unique to ultra-thin material systems, most practically realized with 2D materials. Since the gate oxide is very thick, and does not leak, charge neutrality must hold in the structure. From a charge-balance electrostatic analysis in the extreme cases, i.e. $V_{BG}$>>0 V, and $V_{BG}$<<0 V, treating the degenerately doped Si substrate as a metal, the origin of Schottky barrier modulation can be understood. At these extreme points, much beyond the flat band voltage in either direction, the influence of interfacial fixed charge is minimal. Simplifying the analysis, the charge in the silicon back gate completely overwhelms any fixed interfacial sheet charge in the dielectric (FIG. 7).

For $V_{BG}$>>0 V, large positive mobile sheet charge in the metallic silicon, $Q_M$, is induced. This must be balanced by negative net mirror charge in the MoS$_2$, $Q_{MoS2}$, and graphene, $Q_G$ (i.e. $Q_{MoS2}+Q_M$<0). For $V_{BG}$>>0 V, mobile electrons are induced in the MoS$_2$ (as seen in the transfer curves in FIG. 5(b)). Furthermore, since the applied field is incompletely screened in MoS$_2$, the rest of the negative balance charge must be accommodated in the graphene. The $Q_G$<0 is achieved by a Fermi level above the graphene Dirac K-point in the band-diagram. At $V_{BG}$=+10 V, the electron concentration in MoS$_2$ from C-V (FIG. 6(c)) is approximately 4×10$^{19}$ cm$^{-3}$, corresponding to a Debye screening length of approximately 0.4 nm. This means that the thickness of the MoS$_2$ is approximately 3-5 times the Debye length, leading to approximately 90-99% screening of the electric field from the back-gate. Thus, only a small portion of the field must be accommodated in the graphene and that is why $Q_G$ is small in this case (FIG. 7(a)).

Conversely, for $V_{BG}$<<0 V, $Q_M$<0 is induced, which must be balanced by $Q_{MoS2}$ and $Q_G$>0. Since for $V_{BG}$<<0 V, the electron concentration in MoS$_2$ is reduced to n=0.4×10$^{19}$ cm$^{-3}$ at $V_{BG}$=−20 V (FIG. 6(c) C-V characteristics), corresponding to a Debye length of approximately 1.2 nm which is comparable to the MoS$_2$ thickness. This means that only approximately 30-50% of $V_{BG}$ is screened from the graphene. Thus, a significant portion of the mirror charge to negative $Q_M$ must be accommodated in the graphene, leading to $Q_G$>>0, which is achieved by a fermi level below the graphene Dirac K-point (FIG. 7(b)).

It is noted that the graphene K-point (i.e., graphene conduction band edge) does not need to shift with respect to the conduction band edge of MoS$_2$, consistent with the general assumption in band line-up theory. Finally, the large modulation of $\Phi$ from 0.24-0.91 eV in this study shows the effective transmission of the electric field from the back-gate to the Schottky junction, showing that the influence of trapped charges in the dielectric is small. Larger modulation of $\Phi$ may be achieved by increasing the capacitive coupling of the gate to the Schottky junction (i.e., reducing oxide thickness), and/or using high-k dielectrics, without compromising the quality of the dielectric/semiconductor interfaces. This would enable more of the applied $V_{BG}$ to be transmitted to the Schottky junction, leading to greater modulation of $\Phi$ or a reduction in the range of $V_{BG}$ to achieve the same modulation of $\Phi$.

Figure 8:
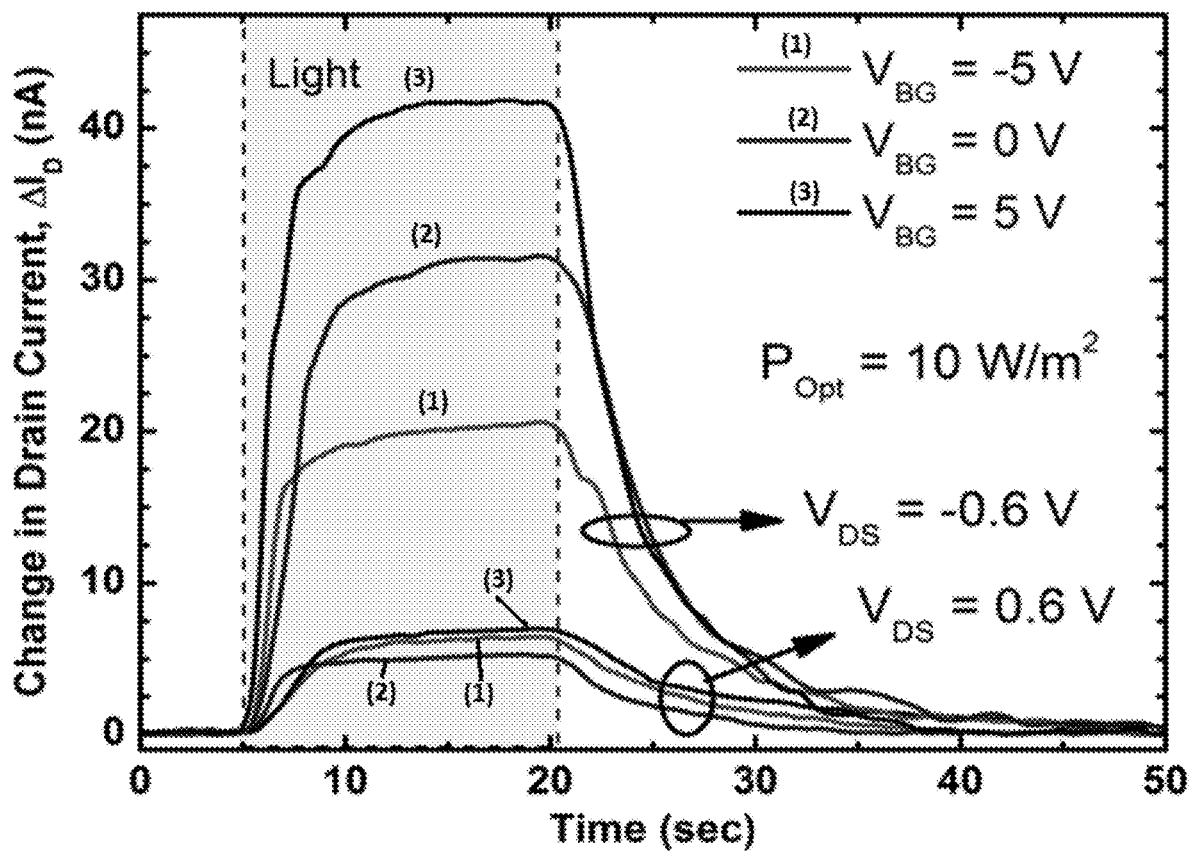
FIG. 8 is a graph illustrating the optical response of a graphene/$MoS_2$ barristor produced using example methods of the present disclosure.

FIG. 8 shows the response of the device to light with 10 W/m$^2$ or 1 mW/cm$^2$ of optical power from a halogen lamp with color temperature 3350 K, and a peak wavelength of approximately 800 nm, close to the MoS$_2$ bandgap of approximately 850 nm (1.45 eV). Electron-hole pairs are generated in the MoS$_2$ by above bandgap light, which are collected by the electric field at the Schottky junction. Three different $V_{BG}$ steps (−5, 0 and 5 V) were used, while the source-drain Schottky junction, $V_{DS}$ was either forward biased or reverse biased at 0.6 V. The photocurrent was smaller for $V_{DS}$=+0.6 V as the electric field at the forward-biased Schottky junction was reduced, reducing charge collection, while the converse was true for $V_{DS}$=−0.6 V. From the C-V measurements, the built-in voltage under illumination decreased by approximately 0.04 V (from 1/C$^2$ intercept, FIG. 6c), across all ranges of $V_{BG}$, indicating that the reverse leakage current of the diode increases under illumination. In this $V_{BG}$ range, the electron density is high enough for the conduction band and the Fermi level to be considered identical, indicating that the Schottky barrier changes by approximately 0.04 eV as well. For example, $\Phi$ is large for $V_{BG}$=−5 V and $V_{DS}$=−0.1 V, leading to lower the overall leakage current levels, while the opposite is true for $V_{BG}$+5 V. Using the transfer curve from I-V in FIG. 7(d), and the change in Φ estimated from the C-V curves in FIG. 6(c), the expected change in $I_{DS}$ can be predicted, and is consistent with the photocurrents actually measured in FIG. 8. Thus, the photocurrent difference due to the variation in $V_{DS}$ can be attributed to the changes in charge collection, whereas that due to the changes in $V_{BG}$ is caused by the variations in reverse leakage in the thermionic emission phenomenon (Equations 4 to 6), which give opposing photoresponse trends.

The responsivity was estimated by accounting for the device area, by using the optical power incident on the 5×100 μm² device and the total measured photocurrent. This gave a peak responsivity of approximately 20 A/W at $V_{BG}$=10V and $V_{DS}$=−0.6 V. Even 100% external quantum efficiency would correspond to a responsivity of approximately 0.2 A/W, which indicates that there is gain in the device. Moreover, due to the very thin layers, only a fraction of the incident light will be absorbed, providing further evidence of internal gain. Given the slow response time of this device, approximately 10 seconds, the high optical responsivity is likely due to the photoconductive gain in the Schottky junction, as an RC limited response time of <1 ms would have been expected (FIG. 6). Photoconductive gain is also supported by C-V (FIG. 6(c)), where the majority carrier concentration increases under illumination. The good ideality and the photoconductive gain can be explained by the interfacial traps that pin the Fermi level of graphene. This phenomenon often leads to an ideality of approximately 1 as seen, for example, in Ge Schottky diodes. The defects at the interface that pin the Fermi level can be responsible for trapping an electron or a hole, leading to photoconductive gain. In devices of the present disclosure, it is hypothesized that holes are trapped at the interface, lowering the barrier, and injecting electrons from the contact for each trapped hole. The barrier lowering for electrons under illumination is seen in the C-V characteristics clearly, which is the basis for the hypothesis. This photoconductive effect leads to internal gain.

In summary, a graphene/MoS$_2$ barristor on an n$^+$ Si/SiO$_2$ substrate was demonstrated using a transfer-free method of growing MoS$_2$. The barrister had barrier height modulation from 0.24-0.91 eV, potentially enabling current control over 10 orders of magnitude at room temperature. Through careful capacitance measurements, it was quantitatively demonstrated that incomplete screening of an electric field from the degenerately doped Si back-gate through the MoS$_2$ leads to the modulation of the Schottky barrier height at the graphene/MoS$_2$ interface through capacitive coupling to the gate. The optical response of the barristor is consistent with the changes in Schottky barrier height caused by the backgate.

Example 3

In this example, the graphene/MoS$_2$ barristor from EXAMPLE 2 will be further investigated with a focus on sensing applications of this device. While graphene is inherently sensitive to many chemical species, the sensitivity can be further enhanced by operating a graphene-based device in the exponential (i.e. subthreshold) regime of the transfer curve. This can be achieved conveniently by a barristor device, where a gate bias can be used to tune the barrier height and hence the transport mechanism. Since high barrier height modulation has been shown, it is expected that a high degree of tunability can also be achieved in the sensitivity of the graphene/MoS$_2$ barristor device.

Figure 9:
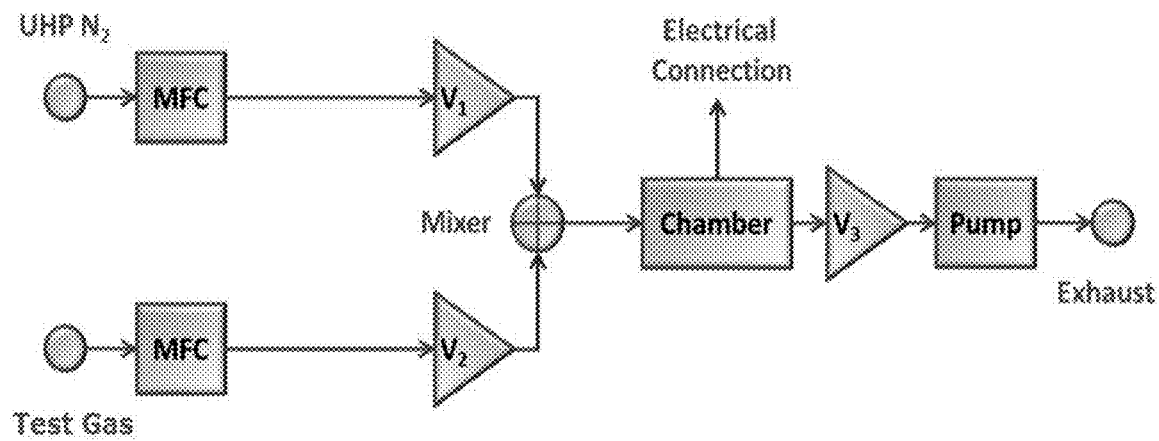
FIG. 9 is a schematic diagram of a gas sensing apparatus used to demonstrate an example method in the present disclosure.

The sensing experiments were done in a small chamber, which housed the wire-bonded sample. The chamber had an inlet and an outlet. Wires from the device were taken out through a small opening near the outlet, which was stuffed with TEFLON® tape. A roughing pump along with a valve ($V_3$ in FIG. 9) was connected to the outlet to quickly remove the analyte vapor out of the chamber whenever necessary. The inlet side of the chamber had a mixer assembly consisting of a mixer junction with valves and two mass flow controllers (MFCs). One mass flow controller (MFC) was used to flow ultra-high purity (UHP) N$_2$, the other one was used to flow the test gas. Both N$_2$ and the test gas lines had two valves ($V_1$ and $V_2$, respectively) connected to control the flow of the gas which eventually merged at the mixer junction, where the gas mixture was fed to the inlet of the chamber. The purpose of using the mixer was to dilute the test gas with UHP N$_2$ to obtain different concentrations. Hence, the flow rates of both MFCs were adjusted to get the desired ratio of N$_2$ and test gas. After each sensing experiment, $V_2$ (vapor flow valve) was closed, but $V_1$ and $V_3$ were kept open. As a result, UHP N$_2$ flushed the chamber while the pump connected to $V_3$ quickly took out the residual gas mixture from the chamber.

The response of the device to the test gas was evaluated in two ways: (1) changing the current (conductance) at constant bias conditions, and (2) changing the junction capacitance at constant bias conditions. For current-based measurements, an AGILENT® B2902 source measuring unit (SMU) was used, while for capacitance-based measurements a HP® 4284A precision LCR meter was used. The test gases utilized were NO$_2$ and NH$_3$, which are commonly used to benchmark the performance of various graphene-based gas sensors. All experiments were performed at room temperature and in a dark environment, to avoid any interference that may arise from the strong photoresponse of the device.

Figure 10A:
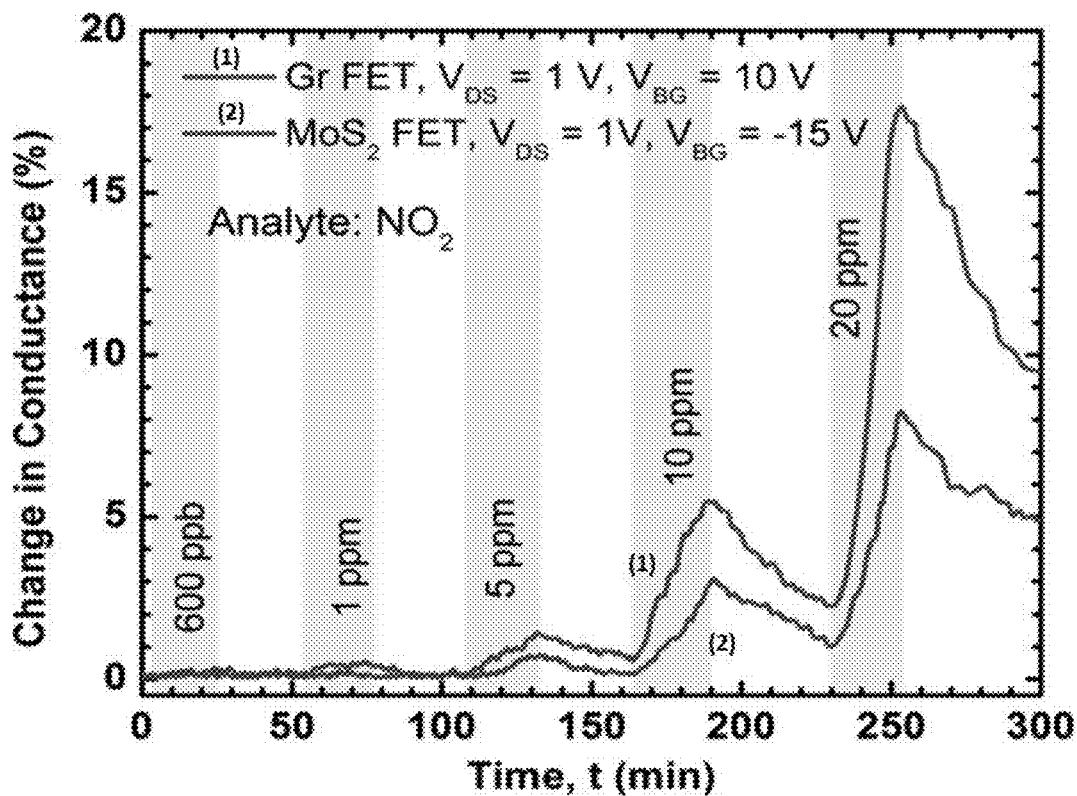
FIG. 10(a) is a graph illustrating the conductivity-based sensing responses of graphene and $MoS_2$ based transistors produced using example methods of the present disclosure.

Since chemical vapor deposition (CVD) graphene is p-type and NO$_2$ serves as an acceptor for graphene, it increases the conductivity of graphene. In FIG. 10(a), the changes in conductance are shown for both MoS$_2$ and graphene based FETs for appropriate bias conditions. For the GFET (i.e. the graphene FET), $V_{BG}$=10 V is just around the Dirac point. In contrast, for the MoS$_2$ FET, $V_{BG}$=−15 V is deep inside the depletion/inversion regime, where a significant hole current is also present due to the weak inversion of MoS$_2$. For both cases, NO$_2$ acts as an acceptor; although charge transfer is weaker in the MoS$_2$ FET, as seen from the smaller change in conductance.

Figure 10B:
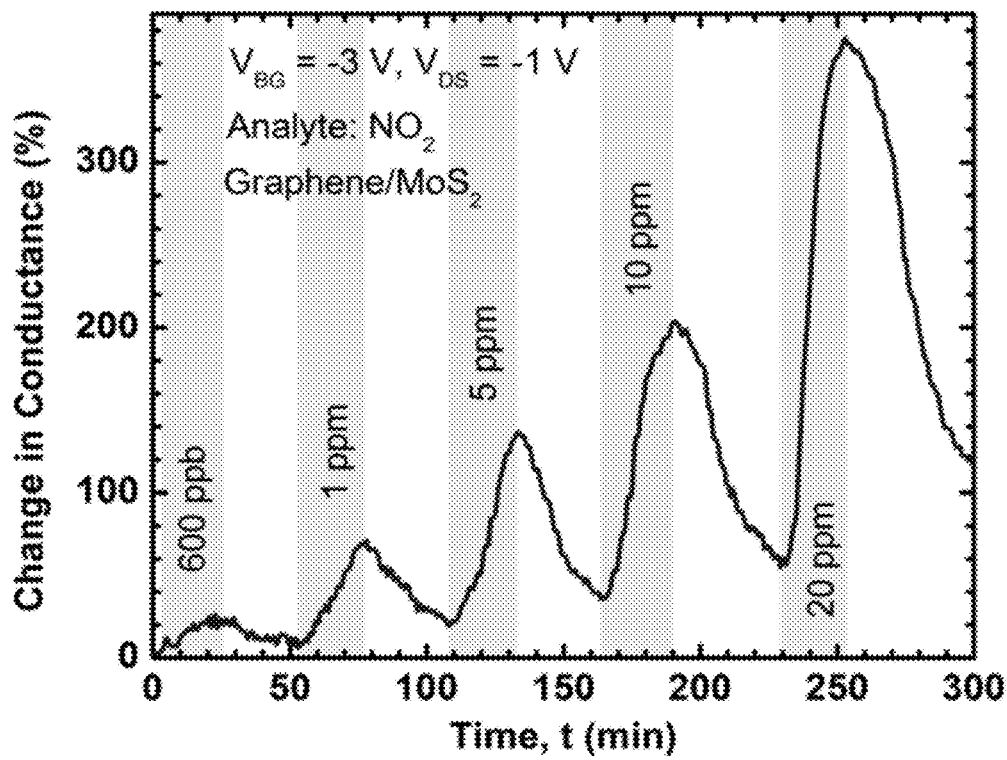
FIG. 10(b) is a graph illustrating the conductivity-based sensing response of a graphene/$MoS_2$ barristor produced using example methods of the present disclosure.
Figure 10C:
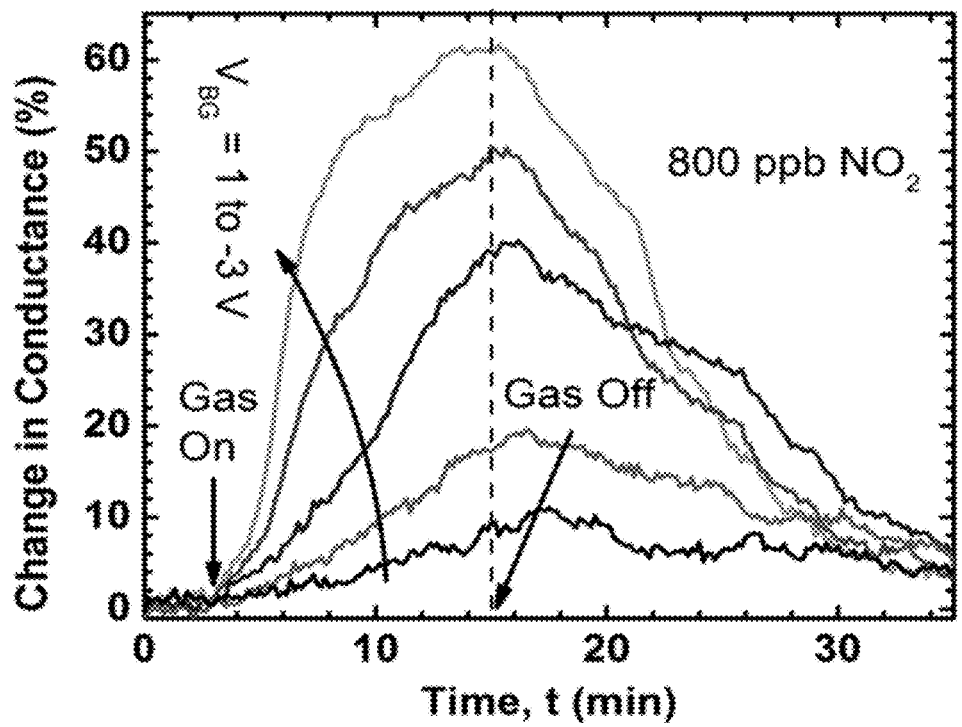
FIG. 10(c) is a graph illustrating the conductivity-based sensing response of a graphene/$MoS_2$ barristor produced using example methods of the present disclosure.

FIG. 10(b) shows the response of the barristor device to various concentrations of NO$_2$ at $V_{BG}$=−3 V, $V_{DS}$=−1 V (dark). For 20 ppm concentration, the response magnitude of the barristor device is about 20 times greater than the GFET and about 50 times greater than the MoS$_2$ FET, which highlights the improved sensitivity that can be achieved using TMD fabrication methods of the present disclosure. This high sensitivity was attributed to the barrier height change in the vertical heterojunction, which causes a sharper change in conductance than the planar GFET and the MoS$_2$ FET devices. While the MoS$_2$ FET is also in the exponential regime (subthreshold regime, in weak inversion), the charge transfer to MoS$_2$ is generally weaker due to difficulty in the adsorption process. As a result, by properly tuning the back gate bias, the lowest concentration level that could be detected using the barristor was approximately 100 ppb, which was far better than a simple GFET. FIG. 10(c) shows the response of the graphene/MoS$_2$ heterojunction device to 800 ppb of NO$_2$ at different gate voltages and V$_{DS}$=−1 V in dark environment.

Interestingly, FIGS. 10(*b*) and 10(*c*) show the barristor current increases in presence of NO$_2$, which means the barrier height is decreasing. In the heterojunction, graphene is on top and will adsorb gas molecules, so any change in barrier height can be attributed to the change in graphene Fermi level. However, the presence of an acceptor should move the graphene Fermi level in downwards direction, and thus increase the barrier height. Instead, a reduced barrier height is apparent due to the increased conductance, which means the graphene Fermi level is moved to the point where NO$_2$ acts as a donor. Another possibility is the combined effect of graphene and MoS$_2$ being exposed to NO$_2$, due to the partial screening any electric field in graphene, which may also result in the NO$_2$ acting as a donor. Since the change in current is highly nonlinear at reverse bias and the current decreases further at negative gate bias (FIG. 6(*a*)), the percentage change in conductance is observed to be more pronounced (FIG. 10(*c*)) at negative V$_{BG}$ due to the smaller base current, negligible series resistance, and higher slope of the transfer characteristics in log scale.

Figure 11A:
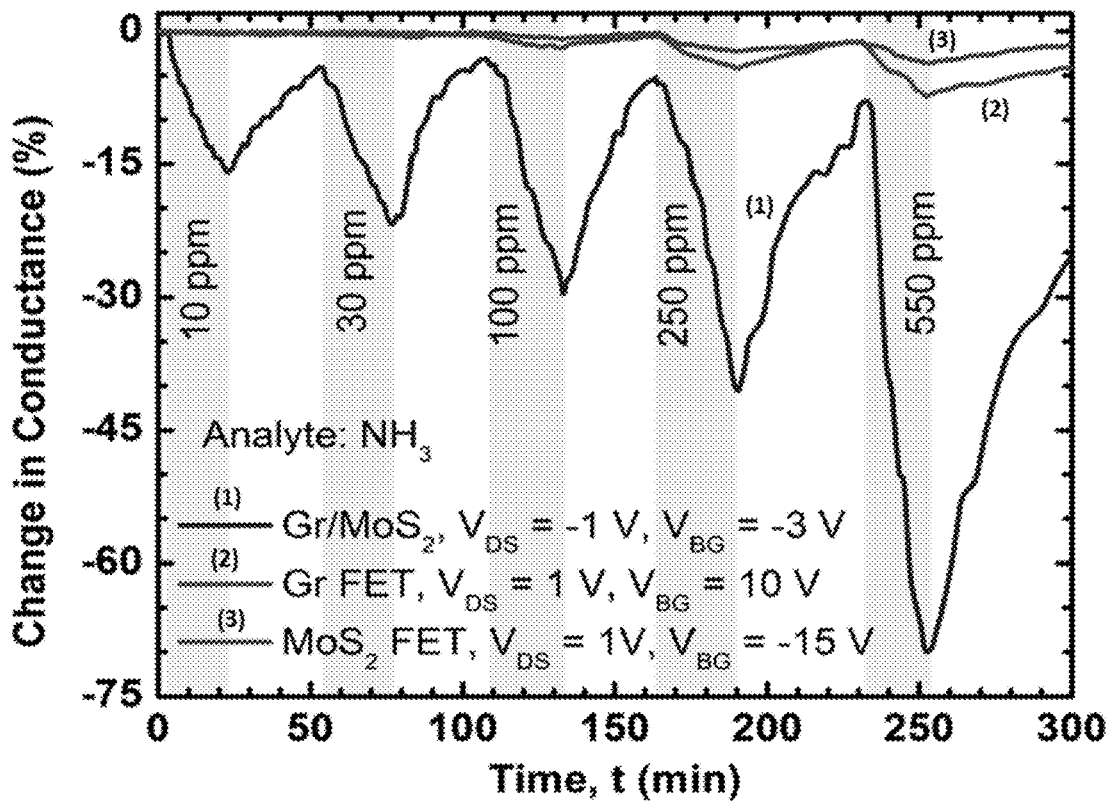
FIG. 11(a) is a graph illustrating the conductivity-based sensing responses of graphene and $MoS_2$ based transistors produced using example methods of the present disclosure.
Figure 11B:
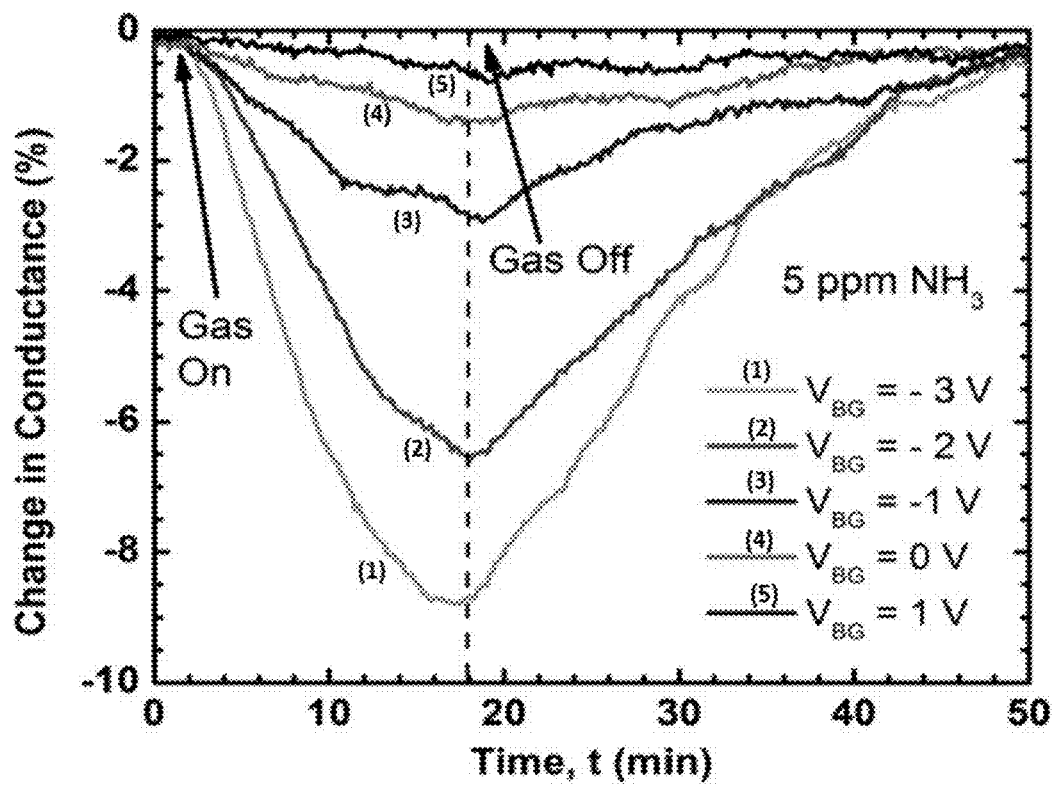
FIG. 11(b) is a graph illustrating the conductivity-based sensing response of a graphene/$MoS_2$ barristor produced using example methods of the present disclosure.

FIG. 11(*a*) shows the responses of the GFET, MoS$_2$ FET and the barristor device to different concentrations of NH$_3$ at the same bias conditions as shown in FIG. 10(*a*) and FIG. 10(*c*). Ammonia (NH$_3$) is a donor for graphene near the Dirac point, which means the carrier concentration is reduced as well as conductance. However, in the barristor configuration, NH$_3$ behaves like an acceptor as it increases the barrier height to reduce reverse bias current. This means the effective work function of NH$_3$ adsorbed to the graphene/MoS$_2$ composite changes such that it becomes an acceptor. Further, the charge transfer also increases significantly (FIG. 11(*a*)), as the barristor response is 7-10 times greater than the GFET and the MoS$_2$ FET devices at 550 ppm concentration. The lowest concentration that could be detected using the barristor was about 1 ppm, by tuning the gate and drain bias voltages FIG. 11(*b*) shows how the bias voltage affects the response of the barristor. Just like NO$_2$, the best sensitivity to NH$_3$ also came at reverse gate bias voltages.

Figure 12A:
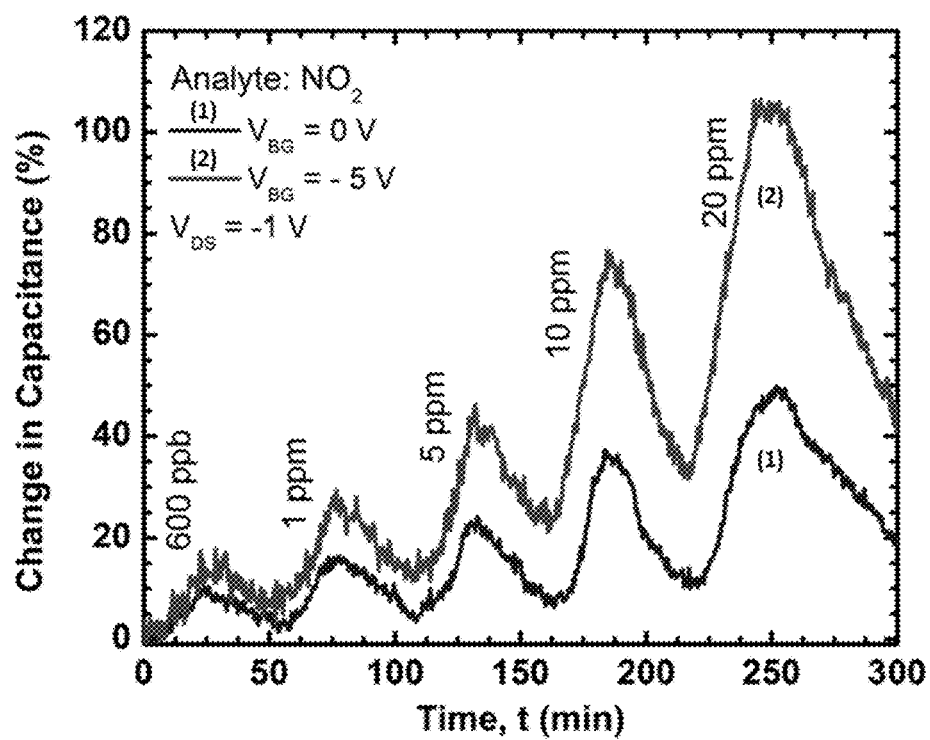
FIG. 12(a) is a graph illustrating the capacitance-based sensing response of a graphene/$MoS_2$ barristor produced using example methods of the present disclosure.
Figure 12B:
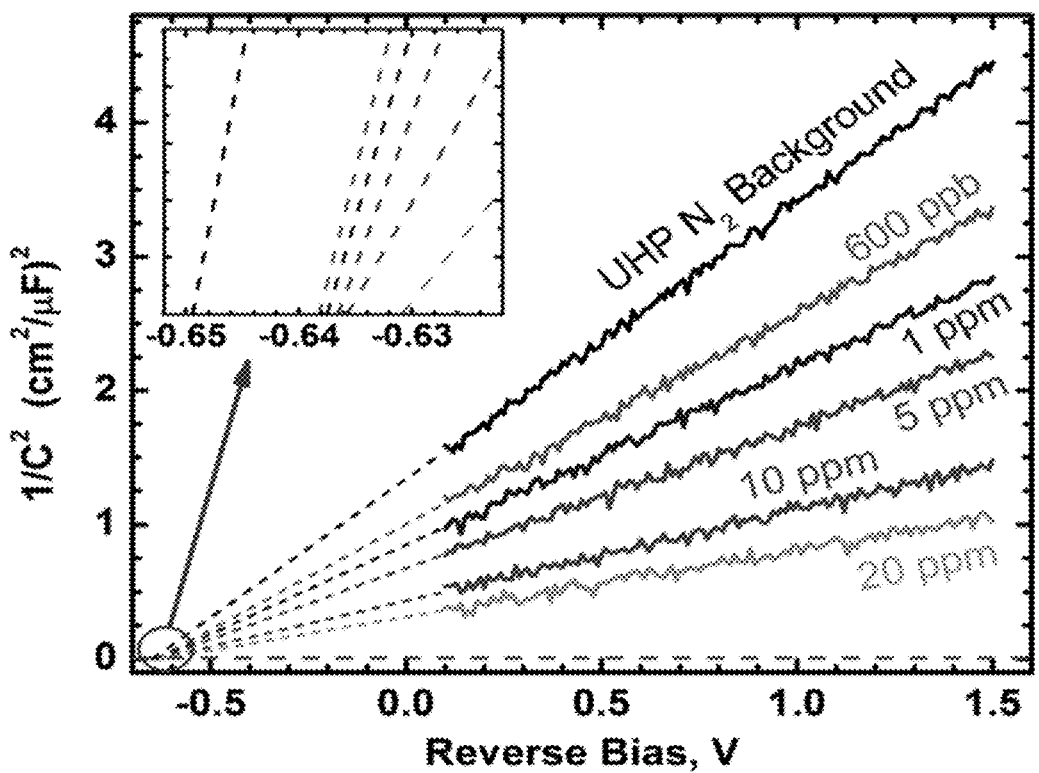
FIG. 12(b) is a graph demonstrating gas sensing behavior via the inverse-squared capacitance-voltage characteristics of a graphene/$MoS_2$ barristor produced using example methods of the present disclosure.

The C-V measurement in presence of an analyte provides direct insight into the barrier height related information of the heterojunction. Measuring capacitance at fixed bias conditions (V$_{BG}$, V$_{DS}$) as a function of time in presence of various concentrations of an analyte shows how quickly these changes take place, as is shown in FIG. 12(*a*). FIG. 12(*a*) shows the rise/fall times are on the order of tens of minutes, which is not surprising for large area graphene based chemical sensors at low analyte concentrations. Since graphene has a very low sticking coefficient, most of the molecules hitting the surface of graphene do not readily adhere to the surface. This is why a significantly faster response can be expected at much higher concentrations.

Figure 13:
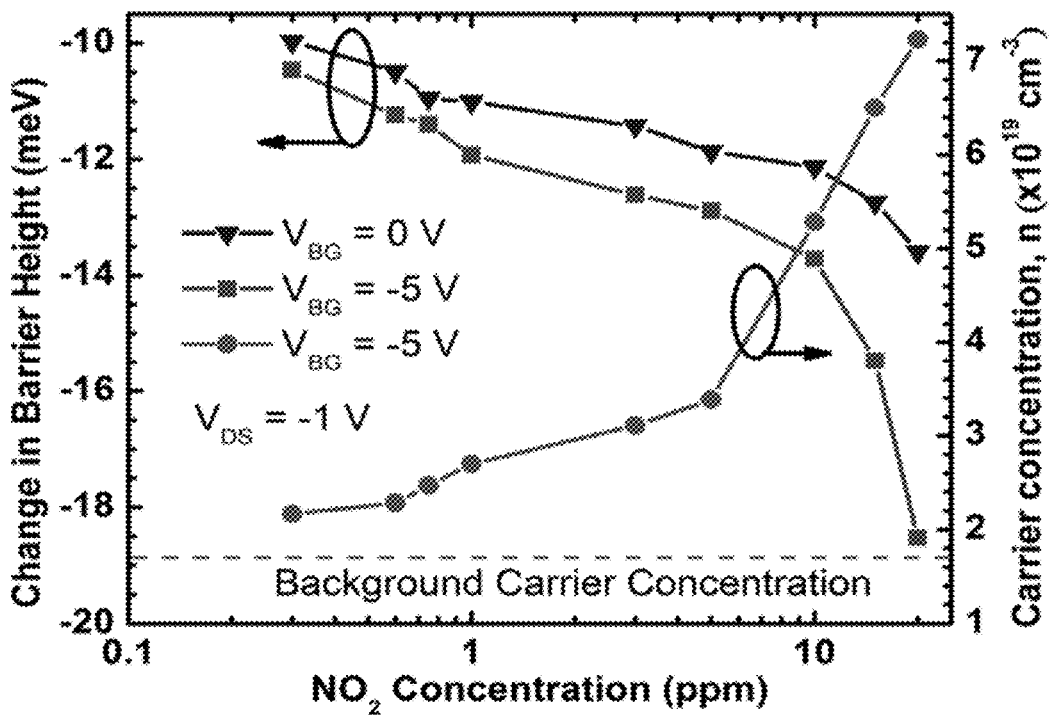
FIG. 13 is a graph illustrating the analyte-induced change in barrier height for a graphene/$MoS_2$ barristor produced using example methods of the present disclosure.

From FIG. 12(*a*), it is clear that the capacitive response of the barristor to NO$_2$ is consistent with the conductance-based response as shown in FIG. 10(*b*) and FIG. 10(*c*). FIG. 12(*b*) helps to explain why the analytes behave differently when adsorbed at the surface of the graphene/MoS$_2$ composite as opposed to bare graphene or MoS$_2$. Here, with the help of 1/C$^2$ vs. V (reverse biased V$_{DS}$) curves, it can be seen that the adsorbed NO$_2$ molecules not only change the barrier height by affecting the Fermi level of graphene, but also affect the carrier concentration in MoS$_2$ as well. This indicates that the MoS$_2$, while being underneath graphene, interacts with the NO$_2$ molecules due to the graphene being atomically thin. As a result, the graphene and MoS$_2$ are not interacting individually with the adsorbed molecules. Rather, they are acting as a composite with different electronic properties which may reverse the role of NO$_2$ and NH$_3$ as dopants. The changes in barrier heights (Φ) and carrier concentrations (n), extracted from the C-V measurements, are shown in FIG. 13 for various concentrations of NO$_2$. The change in barrier height is greater for V$_{BG}$=−5 V because of the sharper slope of Φ vs V$_{BG}$ curve (FIG. 6(*d*)) around this point. Very similar responses were observed for NH$_3$ as well, but with opposite polarity and somewhat lower sensitivity.

In summary, the high quality MoS$_2$ produced using the methods outlined in this disclosure led to the development of a graphene/MoS$_2$ barristor with superior performance and widely tunable barrier height. These barristors could be used to develop highly sensitive chemical and gas sensors. The atomically thin nature of graphene in this barristor device allows both graphene and MoS$_2$ to interact with the analyte species, thus enabling the individual materials to play their respective roles in the sensing mechanism. Hence, it is confirmed that the quality of the underlying MoS$_2$ can significantly affect the performance of this type of devices and highlights the benefit of a novel synthesis technique showing notable improvement in MoS$_2$ quality.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed:

1. A method of fabricating a transition metal dichalcogenide structure comprising:
    forming a layer on a substrate, the layer comprising a transition metal, the layer having a first thickness;
    contacting the layer with a flow comprising oxygen at a partial pressure of from about 0.1 Torr to about 25 Torr, and thereby oxidizing the transition metal of the layer to form a transition metal oxide, a first portion of the transition metal oxide sublimating upon the formation and a second portion of the transition metal oxide being retained in the layer, wherein following the contact with the flow comprising oxygen, the layer has a second thickness that is less than the first thickness; and
    contacting the transition metal oxide of the layer with a chalcogen to form a transition metal dichalcogenide.

2. The method of claim 1, wherein the transition metal comprises molybdenum and the chalcogen comprises sulfur.

3. The method of claim 1, wherein the substrate comprises silicon, silicon dioxide, or n-doped silicon dioxide.

4. The method of claim 1, further comprising locating the substrate within a process chamber following the forming of the layer and prior to contacting the layer with the flow comprising oxygen.

5. The method of claim 4, further comprising preparing the process chamber by vacuuming the process chamber and purging the process chamber with an inert gas prior to locating the substrate within the process chamber.

6. The method of claim 1, wherein the step of forming the layer on the substrate comprises: performing a lithographic process on the substrate to open windows on the substrate; and applying the transition metal in the windows on the substrate to form the layer.

7. The method of claim 1, wherein the step of forming the layer on the substrate comprises: electron beam evaporation to remove one or more monolayers of the transition metal prior to contacting the layer with the flow comprising oxygen.

8. The method of claim 1, wherein the layer comprising the transition metal dichalcogenide is from 3 to 5 monolayers in thickness.

9. The method of claim 1, wherein the step of contacting the layer with the flow comprising oxygen is carried out at a first temperature range of from about 350° C. to about 400° C.

10. The method of any of the previous claims, wherein the step of contacting the transition metal oxide of the layer with a chalcogen is carried out at a second temperature range of from 450° C. to 500° C.

11. The method of claim 1, wherein the step of contacting the transition metal oxide of the layer with a chalcogen is carried out at a temperature of less than about 650° C.

12. The method of claim 1, further comprising a first annealing step carried out at a third temperature range of from about 550° C. to about 700° C.

13. The method of claim 12, further comprising flushing an inert gas through the process chamber prior to the first annealing step.

14. The method of claim 12, further comprising a second annealing step carried out at a fourth temperature range of greater than about 800° C.

15. The method of claim 1, further comprising forming metal contacts on the substrate and sintering the metal contacts.

16. The method of claim 1, wherein the step of contacting the transition metal oxide of the layer with the chalcogen comprises vaporizing a solid chalcogen.

17. The method of claim 1, wherein the step of contacting the transition metal oxide of the layer with the chalcogen comprises contacting the transition metal oxide with a chalcogen gas at a partial pressure of from about 0.1 Torr to about 20 Torr.

18. The method of claim 1, wherein the chalcogen comprises sulfur, selenium, tellurium, or a mixture thereof.

* * * * *